(12) United States Patent
Gong et al.

(10) Patent No.: US 10,374,508 B2
(45) Date of Patent: Aug. 6, 2019

(54) CAPACITOR DISCHARGING

(71) Applicant: Infineon Technologies Austria AG, Villach (AT)

(72) Inventors: Xiaowu Gong, Singapore (SG); Siu Kam Kok, Singapore (SG); Yong Siang Teo, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 255 days.

(21) Appl. No.: 14/980,985

(22) Filed: Dec. 28, 2015

(65) Prior Publication Data

US 2017/0187217 A1    Jun. 29, 2017

(51) Int. Cl.
| | | |
|---|---|---|
| *H02M 1/12* | (2006.01) | |
| *H02M 1/32* | (2007.01) | |
| *H02M 7/06* | (2006.01) | |
| *G01R 19/155* | (2006.01) | |
| *H02J 7/00* | (2006.01) | |

(52) U.S. Cl.
CPC .......... *H02M 1/126* (2013.01); *G01R 19/155* (2013.01); *H02M 7/06* (2013.01); *H02M 2001/322* (2013.01)

(58) Field of Classification Search
CPC ................................ H02J 7/0068; H02J 7/00
USPC ........................................................ 320/136
See application file for complete search history.

(56) References Cited

U.S. PATENT DOCUMENTS

| | | | | |
|---|---|---|---|---|
| 4,063,182 A | * | 12/1977 | Besson ................ | G11C 27/026 327/73 |
| 6,194,885 B1 | * | 2/2001 | Oshima ............... | H02M 1/4225 323/285 |
| 6,316,883 B1 | * | 11/2001 | Cho ....................... | H05B 41/28 315/209 R |
| 7,235,999 B2 | * | 6/2007 | Goetting ............ | G01R 31/3167 326/14 |
| 8,222,772 B1 | * | 7/2012 | Vinciarelli .......... | H02M 1/4258 307/140 |
| 8,710,806 B2 | | 4/2014 | Moon et al. | |
| 9,087,656 B1 | * | 7/2015 | Vinciarelli ............... | H01H 9/54 |
| 2011/0249476 A1 | * | 10/2011 | Chen .................... | H02H 1/0007 363/52 |

(Continued)

OTHER PUBLICATIONS

"FAN6757—mWSaver PWM Controller," Rev. 1.0.1, Fairchild Semiconductor Corporation, Nov. 2013, 17 pp.

(Continued)

*Primary Examiner* — Richard Isla
*Assistant Examiner* — Dung V Bui
(74) *Attorney, Agent, or Firm* — Shumaker & Sieffert, P.A.

(57) ABSTRACT

An example method includes storing a peak voltage level, a valley voltage level, and a frequency of a signal that corresponds to an alternating current (AC) signal across a capacitor; periodically determining whether a current peak voltage level of the signal is different than the stored peak voltage level of the signal or a current valley voltage level of the signal is different than the stored valley voltage level of the signal; determining, based on whether the current peak voltage level of the signal is different than the stored peak voltage level or the current valley voltage level of the signal is different than the stored valley voltage level, whether the AC signal has been removed from the capacitor; and in response to determining that the AC signal has been removed from the capacitor, discharging the capacitor.

20 Claims, 14 Drawing Sheets

(56) References Cited

U.S. PATENT DOCUMENTS

| | | | | |
|---|---|---|---|---|
| 2012/0201055 | A1* | 8/2012 | Moon | H02M 1/4258 363/21.02 |
| 2013/0147440 | A1* | 6/2013 | Shiroyama | G01R 31/40 320/166 |
| 2013/0335038 | A1* | 12/2013 | Lee | H02M 1/126 320/166 |
| 2014/0036559 | A1* | 2/2014 | Watanabe | G01R 19/00 363/84 |
| 2015/0048678 | A1* | 2/2015 | Gong | H05B 33/0854 307/24 |
| 2015/0263600 | A1* | 9/2015 | Bhandarkar | H02M 7/219 363/44 |
| 2015/0288286 | A1* | 10/2015 | Chu | H02M 3/33507 363/21.12 |

OTHER PUBLICATIONS

"Household and similar electrical appliances—Safety—Part 1: General requirements," IEC International Standard Preview, IEC 60335-1, Edition 5.0, May 2010, 25 pp.

"Information technology equipment—Safety—Part 1: General requirements," IEC International Standard Preview, IEC 60950-1, Edition 2.0, Dec. 2005, 33 pp.

"A.C. electric ventilating fans and regulators for household and similar purposes," IEC International Standard Preview, IEC 60665, 1st Edition, Jan. 1980, 7 pp.

"Safety requirements for electrical equipment for measurement, control, and laboratory use—Part 1: General requirements," IEC International Standard Preview, IEC 61010-1, Edition 3.0, Jun. 2010, 37 pp.

* cited by examiner

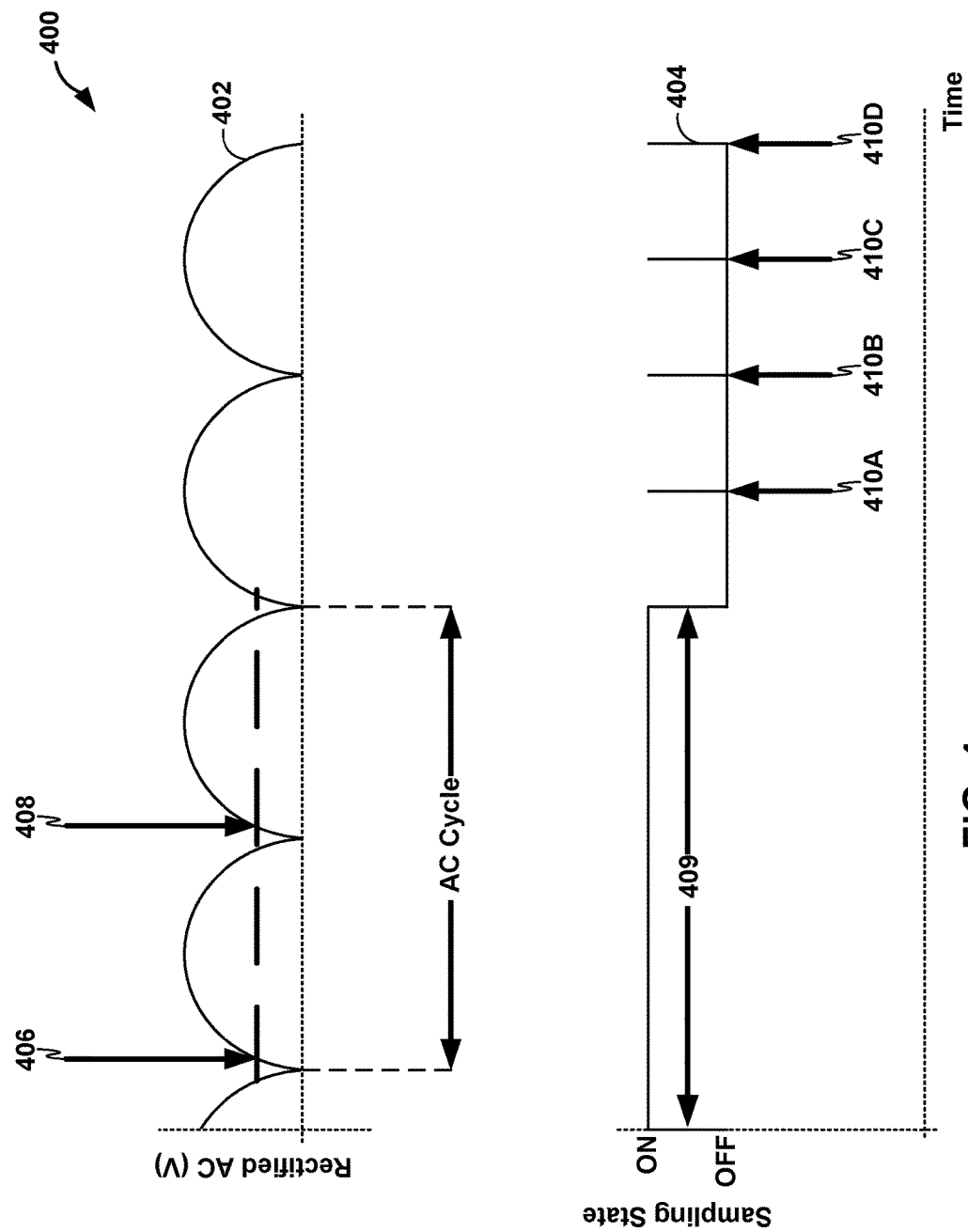

CAPACITOR DISCHARGING

TECHNICAL FIELD

This disclosure relates to power supplies, and more specifically to the discharging of x-capacitors in power supplies.

BACKGROUND

A device, such as a power supply, that receives line-level AC power may include one or more components to improve the functionality of the device. For instance, a device may include a capacitor electrically positioned across two of the conductors (e.g., across the hot and neutral conductors in North America or the L-1 and L-2 conductors in Europe) to filter the line-level AC power signal. In some examples, such a capacitor may be referred to as an x-capacitor.

However, in some examples, the inclusion of an x-capacitor may present one or more disadvantages. For instance, the conductors of a plug of a device that includes an x-capacitor may remain charged after the plug has been removed from an outlet, which may be hazardous.

SUMMARY

In one example, a method includes storing, by a device, a peak voltage level, a valley voltage level, and a frequency of a signal that corresponds to an alternating current (AC) signal across a capacitor; periodically determining, by the device and at a frequency determined based on the stored frequency of the signal, whether a current peak voltage level of the signal is different than the stored peak voltage level of the signal or a current valley voltage level of the signal is different than the stored valley voltage level of the signal; determining, based on whether the current peak voltage level of the signal is different than the stored peak voltage level or the current valley voltage level of the signal is different than the stored valley voltage level, whether the AC signal has been removed from the capacitor; and in response to determining, by the device, that the AC signal has been removed from the capacitor, discharging the capacitor In another example, a device includes one or more components configured to discharge a capacitor; an analog-to-digital converter (ADC) configured to generate samples that represent voltage levels of a signal that corresponds to an AC signal across the capacitor; and one or more processors. In this example, the one or more processors are configured to: determine, based on samples generated by the ADC, a peak voltage level, a valley voltage level, and a frequency of the signal; periodically determine, based on samples generated at a frequency determined based on the stored frequency of the signal, whether a current peak voltage level of the signal is different than the stored peak voltage level of the signal or a current valley voltage level of the signal is different than the stored valley voltage level of the signal; determine, based on whether the current peak voltage level of the signal is different than the stored peak voltage level or the current valley voltage level of the signal is different than the stored valley voltage level, whether the AC signal has been removed from the capacitor; and in response to determining that the AC signal has been removed from the capacitor, cause the one or more components to discharge the capacitor.

In another example, a device includes means for storing a peak voltage level, a valley voltage level, and a frequency of a signal that corresponds to an AC signal across a capacitor; means for periodically determining, at a frequency determined based on the stored frequency of the signal, whether a current peak voltage level of the signal is different than the stored peak voltage level of the signal or a current valley voltage level of the signal is different than the stored valley voltage level of the signal; means for determining, based on whether the current peak voltage level of the signal is different than the stored peak voltage level or the current valley voltage level of the signal is different than the stored valley voltage level, whether the AC signal has been removed from the x-capacitor; and means for discharging the capacitor in response to determining that the AC signal has been removed from the x-capacitor.

Details of these and other examples are set forth in the accompanying drawings and the description below. Other features, objects, and advantages will be apparent from the description and drawings, and from the claims.

BRIEF DESCRIPTION OF DRAWINGS

FIG. 4 is a graph illustrating example signals and operations of a device to determine a peak voltage level, a valley voltage level, and a frequency of an AC signal, in accordance with one or more techniques of this disclosure.

DETAILED DESCRIPTION

In general, this disclosure is directed to devices, systems, and techniques for discharging capacitors electrically positioned across two conductors (e.g., across the hot and neutral conductors in North America or the L-1 and L-2 conductors in Europe) to filter the line-level AC power signal, such as x-capacitors. As noted above, the inclusion of an x-capacitor may present one or more disadvantages, such as the conductors of a plug of a device that includes an x-capacitor remaining charged after the plug has been removed from an outlet. Some international safety standards contain requirements that may address this potential hazard. For instance, International Electrotechnical Commission standard IEC61.010-1, "Safety Requirements for Electrical Equipment for Measurement, Control, and Laboratory Use—Part 1: General Requirements," (available at https://webstore.iec.ch/publication/4279), hereinafter "IEC61010-1", requires that the AC (live) pin should not be hazardous within five seconds after disconnection from the supply power signal.

Figure 1:
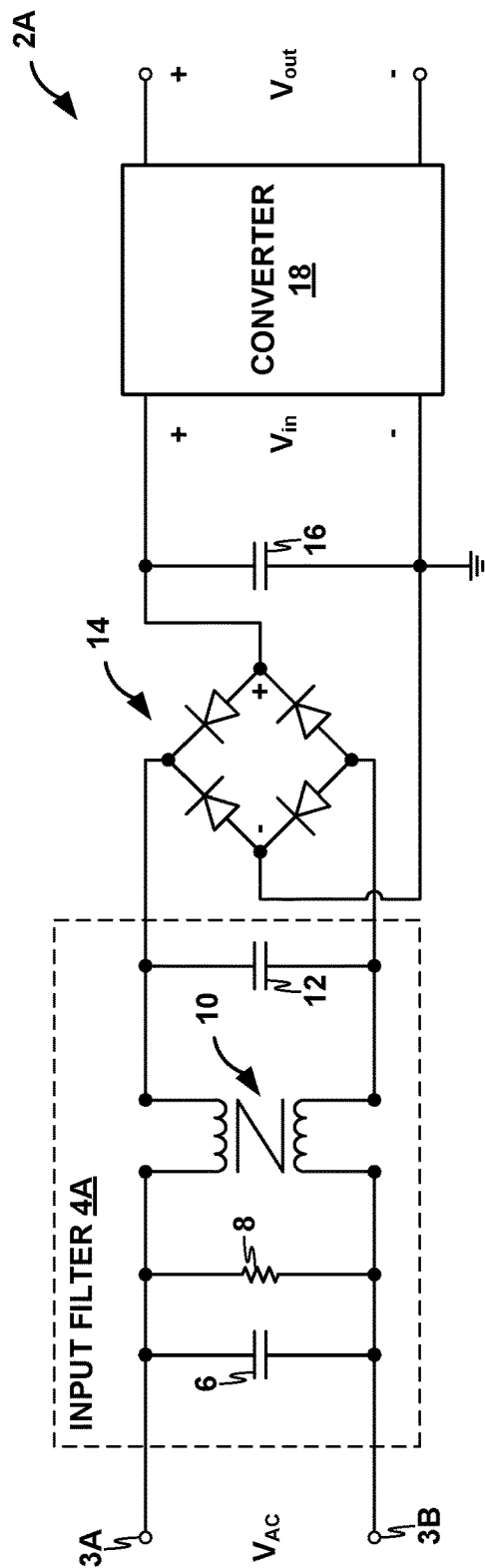
FIG. 1 is a schematic diagram illustrating a device that includes an x-capacitor and one or more components configured to be discharge the x-capacitor.

FIG. 1 is a schematic diagram illustrating device 2A that includes an x-capacitor and one or more components configured to be discharge the x-capacitor. As illustrated in FIG. 1, device 2A includes connectors 3A and 3B (collectively, "connectors 3"), input filter 4A, rectifier 14, input capacitor 16, and converter 18. In the example of FIG. 1, device 2A comprises a power supply configured to convert input AC power signal $V_{AC}$ into regulated DC voltage $V_{OUT}$.

Input filter 4 may be configured to filter and/or stabilize input power signal $V_{AC}$. As illustrated in FIG. 1, input filter 4A may include capacitor 6, discharge resistor 8, choke coil 10, and capacitor 12. In some examples, one or both of capacitor 6 and capacitor 12 may be referred to as an x-capacitor.

Rectifier 14 may be configured to rectify filtered AC power signal $V_{AC}$ into input voltage $V_{IN}$. As illustrated in FIG. 1, rectifier 14 may include four diodes arranged in a bridge configuration, although other types of rectifiers could also be used consistent with this disclosure. As shown in FIG. 1, device 2A may also include input capacitor 16, which may be configured to smooth the rectified signal generated by rectifier 14.

Converter 18 may be configured to convert an input signal into an output signal. For instance, as shown in the example of FIG. 1 where converter 18 comprises a DC to DC converter, converter 18 may convert input DC signal $V_{in}$, which may be at a first voltage level, into output DC signal $V_{out}$, which may be at a second voltage level.

In operation, connectors 3 may be charged with input AC power signal $V_{AC}$. For instance, where connectors 3 are included in a plug, the plug may be inserted into an outlet. Input filter 4A may filter and/or stabilize input power signal $V_{AC}$, rectifier 14 may transform the filtered AC signal into DC signal $V_{in}$ which may be smoothed by input capacitor 16. Converter 18 may convert DC signal $V_{in}$ into output DC signal $V_{out}$.

When connectors 3 are charged with input AC power signal $V_{AC}$, capacitor 6 and capacitor 12 may become charged, potentially at with a high voltage level. However, when input AC power signal $V_{AC}$ is removed from connectors 3, capacitor 6 and capacitor 12 may remain charged. As discussed above, it may be desirable for connectors 3 to cease being hazardous within five seconds after disconnection from the supply power signal.

In accordance with one or more techniques of this disclosure, device 2A may include discharge resistor 8 which may be configured to discharge capacitor 6 and/or capacitor 12. For instance, as shown in FIG. 1, discharge resistor 8 may be positioned in parallel with resistor 6. In this way, once input AC power signal $V_{AC}$ is removed from connectors 3, discharge resistor 8 may discharge capacitor 6 and capacitor 12, which may cause the voltage across connectors 3 to become non-hazardous. As such, the value of discharge resistor 8 may be selected such that the voltage across connectors 3 is not hazardous within five seconds after input AC power signal $V_{AC}$ is removed.

However, in some examples, it may be undesirable for a device to include a discharge resistor across the AC input connectors (i.e., connectors 3). For instance, as discharge resistor 8 is positioned across connectors 3, discharge resistor 8 may constantly consume power. The constant consumption of power may be even less desirable when device 2A is configured to operate in low-power modes, such as a standby mode (e.g., where device 2A is connected to input AC power signal $V_{AC}$ but not providing output power signal $V_{out}$). In such modes, it may be desirable for device 2A to minimize the amount of power consumed. Additionally, various standards and/or regulations may limit the amount of power that a device may consume in a low-power mode. As one example, EPS 2014 limits the amount of power that may be consumed by a power supply with no load to 100 milli-watts (mW). As another example, in order to obtain a European Certificate of Conformity (CoC), a power supply may not consume more than 75 milli-watts (mW) no load. As such, it may be desirable for a device to include a capacitor across an input AC power signal, for the capacitor to be discharged when the AC power signal is removed, and have minimal standby power consumption.

Figure 2:
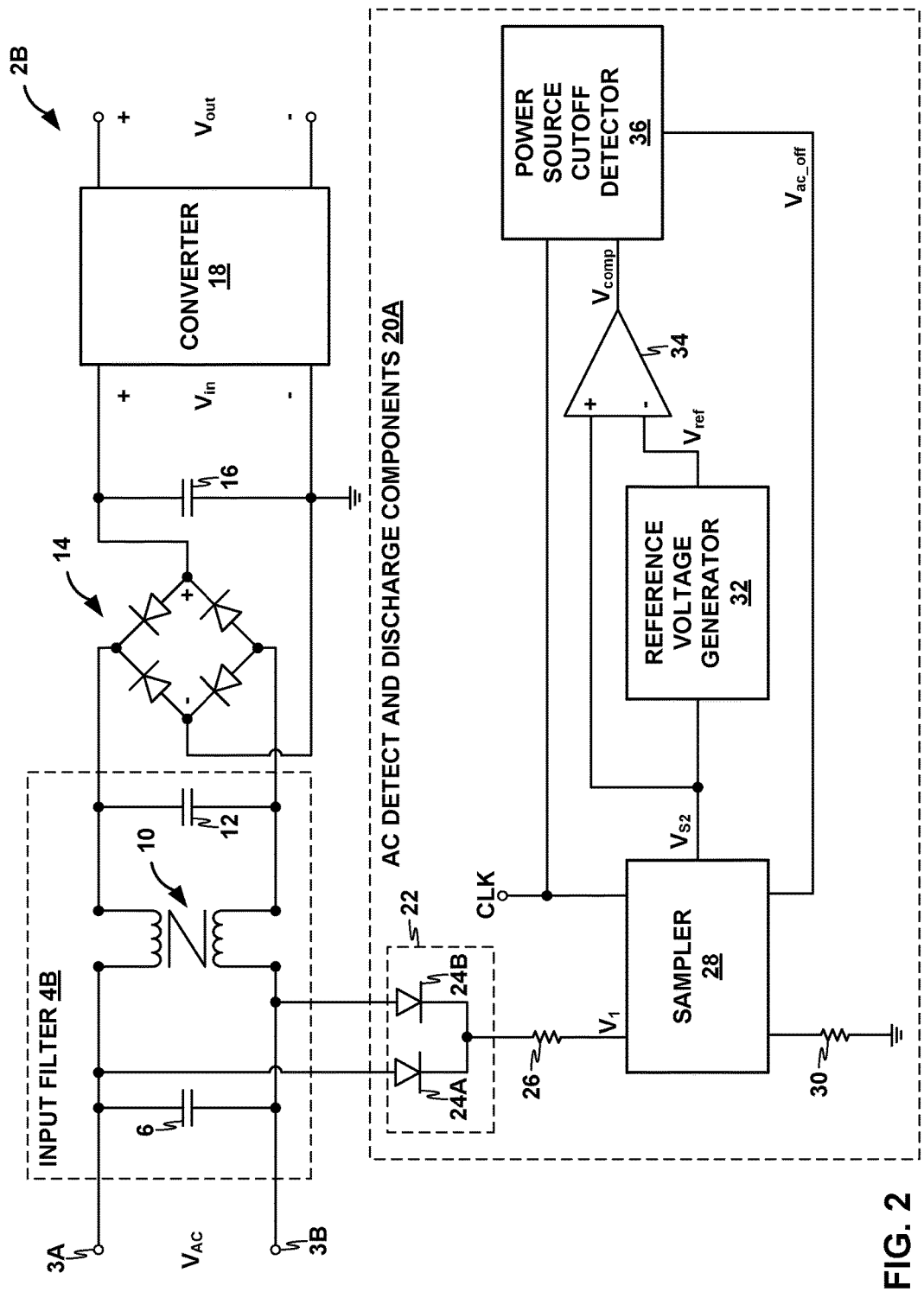
FIG. 2 is a schematic diagram illustrating a device that includes an x-capacitor and one or more components configured to be discharge the x-capacitor.

FIG. 2 is a schematic diagram illustrating device 2B that includes an x-capacitor and one or more components configured to be discharge the x-capacitor. Device 2B may be configured to perform operations similar to device 2A of FIG. 1. However, as illustrated in FIG. 2, as opposed to including discharge resistor 8, device 2B includes AC detect and discharge components 20A (hereinafter D&D components 20A).

D&D components 20A may be configured to detect when input AC power signal $V_{AC}$ has been removed from connectors 3, and discharge capacitor 6 and capacitor 12 in response to detecting that input AC power signal $V_{AC}$ has been removed from connectors 3. As illustrated in FIG. 2, D&D components 20A may include rectifier 22, resistor 26, sampler 28, resistor 30, reference voltage generator 32, comparator 34, and power source cutoff detector 36.

Rectifier 22 may be configured to rectify input AC signal $V_{AC}$ to generate a rectified signal which is passed through resistor 26 to result in $V_1$. Sampler 28 may sample $V_1$ according to a period Tsampling of a clock signal CLK to generate a second sampling signal $V_{S2}$. In particular, sampler 28 may periodically sample $V_1$ (i.e., at multiples of 90° of the input sine wave).

Reference voltage generator 32 may generate a reference voltage $V_{ref}$ from the second sampling signal $V_{S2}$. In particular, reference voltage generator 32 may generate reference voltage $V_{ref}$ based on the peak voltage of second sampling signal $V_{S2}$, which may correspond to the peak voltage of input AC signal $V_{AC}$.

Comparator 34 may compare the second sampling signal $V_{S2}$ with the reference voltage $V_{ref}$ to output a comparison signal $V_{comp}$. Power source cutoff detector 36 may determine, based on the comparison signal $V_{comp}$, whether the input AC signal $V_{AC}$ has been removed from connectors 3. In particular, power source cutoff detector 36 may determine that the input AC signal $V_{AC}$ has been removed from connectors 3 where the second sampling signal $V_{S2}$ is less than the reference voltage $V_{ref}$ for n-bit time. The time for n-bit may be eight AC cycles, or 160 milli-seconds (ins) for a 50 hertz (Hz) input AC signal.

If power source cutoff detector 36 determines that the input AC signal $V_{AC}$ has been removed from connectors 3, power source cutoff detector 36 may output power source cutoff signal $V_{ac\_off}$ to cause sampler 28 to discharge capacitor 6 and capacitor 12 via resistor 30. In this way, once input AC power signal $V_{AC}$ is removed from connectors 3, D&D components 20A may discharge capacitor 6 and capacitor 12, which may cause the voltage across connectors 3 to become non-hazardous.

However, in some examples, it may be undesirable to utilize D&D components 20A to detect when input AC power signal $V_{AC}$ has been removed. For instance, as discussed above, the time elapsed from the point where input AC power signal $V_{AC}$ is removed and D&D components 20A determine that the input AC power signal $V_{AC}$ was removed is eight AC cycles. As it is desirable for connectors 3 to become non-hazardous as soon as possible, any additional delay in the detection of the removal of input AC power signal $V_{AC}$ may not be desirable.

Additionally, D&D components 20A base the determination of whether the input AC signal $V_{AC}$ has been removed only on the peak voltage of the input AC signal $V_{AC}$ (i.e., without regard for the valley voltage of the input AC signal $V_{AC}$). Basing the determination only on the peak voltage may not be desirable as, in sonic examples, the sensed AC waveform (i.e., $V_1$) may have a non-zero valley voltage. If the sensed AC waveform is higher than the reference voltage, then a mis-triggering error may occur within D&D components 20A.

Furthermore, the touch current (also referred to as pulse current) resulting from D&D components 20A may be undesirably high. In some examples, such as when complying with various standards (e.g., standards defined by IEC60665, IEC60950, or IEC60335-1) it may be desirable for the touch current to be less than 0.25 milli-amps (mA) root-mean-squared (rms) and less than 0.35 mA peak. However, the peak touch current resulting from D&D components 20A may be greater than 0.35 mA.

As such, it may be desirable for a device to include a capacitor across an input AC power signal, for the capacitor to be discharged when the AC power signal is removed, for the device to be able to detect removal of the AC power signal in less than eight AC cycles, for the device to properly determine whether AC power signals with non-zero valley voltages have been removed, for the resulting pulse current to be less than 0.35 mA peak, and for the device to have minimal standby power consumption.

Figure 3:
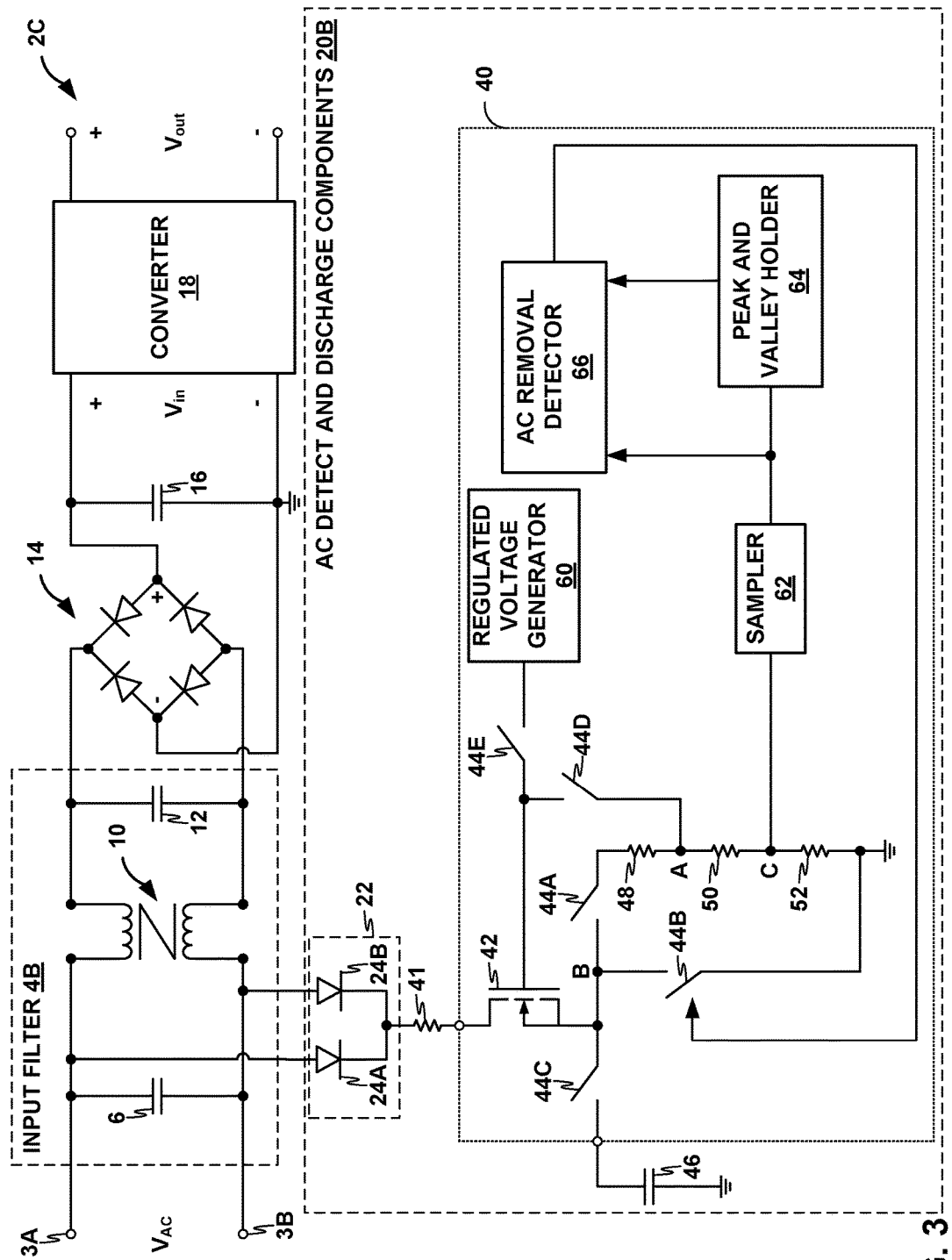
FIG. 3 is a schematic diagram illustrating s device that includes an x-capacitor and one or more components configured to be discharge the x-capacitor, in accordance with one or more techniques of this disclosure.

FIG. 3 is a schematic diagram illustrating device 2C that includes an x-capacitor and one or more components configured to be discharge the x-capacitor, in accordance with one or more techniques of this disclosure. Device 2C may be configured to perform operations similar to device 2A of FIGS. 1 and 2B of FIG. 2. However, as illustrated in FIG. 3, as opposed to including AC detect and discharge components 20A, device 2C includes AC detect and discharge components 20B (hereinafter D&D components 20B).

D&D components 20B may be configured to detect when input AC power signal $V_{AC}$ has been removed from connectors 3, and discharge capacitor 6 and capacitor 12 in response to detecting that input AC power signal $V_{AC}$ has been removed from connectors 3. As illustrated in FIG. 3, D&D components 20B may include rectifier 22, resistor 41, transistor 42, switches 44A-44E (collectively, "switches 44"), V capacitor 46, resistor 48, resistor 50, resistor 52, regulated voltage generator 60, sampler 62, peak and valley voltage holder 64, and AC removal detector 66. In some examples, one or more components of D&D components 20B may be included in an integrated circuit (IC). For instance, transistor 42, switches 44, resistor 48, resistor 50, resistor 52, regulated voltage generator 60, sampler 62, peak and valley voltage holder 64, and AC removal detector 66 may be included in IC 40.

In some examples, D&D components 20B may include transistor 42. In sonic examples, transistor 42 may perform one or more functions. For instance, transistor 42 may be operable to charge $V_{cc}$ capacitor 46, to enable sensing of the voltage of the rectified AC signal generated by rectifier 22, and to enable discharging of capacitors 6 and 12. Examples of transistor 42 include, but are not necessarily limited to, one or more metal-oxide-semiconductor field-effect transistors (MOSFETs), one or more gallium nitride (GaN) switches, one or more thyristors, one or more insulated-gate bipolar transistors (IGBTs), and/or a combination of the same. In examples where transistor 42 includes one or more MOSFETs, the one or more MOSFETs may include one or more depletion mode MOSFETS and/or one or more enhancement mode MOSFETs.

In some examples, D&D components 20B may include regulated voltage generator 60, which may be configured to generate a regulated voltage. Regulated voltage generator 60 may output the regulated voltage to one or more other components of D&D components 20B, such as switch 44E.

In some examples, D&D components 20B may include sampler 62, which may be configured to generate samples of a voltage signal. For instance, as shown in the example of FIG. 3, sampler 62 may be configured to generate samples of the voltage signal at node C. In some examples, sampler 62 may be configured to periodically generate the samples (i.e., at a sampling frequency). For instance, sampler 62 may be configured to generate a sample of the voltage signal at node C at a frequency determined based on the frequency of the input AC power signal $V_{AC}$. As one example, sampler 62 may be configured to generate a sample of the voltage signal at node C at a quarter of the frequency of the input AC power signal $V_{AC}$ (i.e., $f_L/4$, where $f_L$ is the frequency of the input AC power signal $V_{AC}$). In some examples, the samples generated by sampler 62 may be digital samples. In some of such examples, sampler 62 may include one or more analog-to-digital converters (ADCs). In some examples, the samples generated by sampler 62 may be analog samples.

In some examples, D&D components 20B may include peak and valley holder 64. In some examples, such as where the samples generated by sampler 62 are digital samples, peak and valley holder 64 may include one or more memory elements configured to store the digital samples. For instance, peak and valley holder 64 may include a first register configured to store a sample corresponding to the peak voltage of the input AC power signal $V_{AC}$, a second register configured to store a sample corresponding to the valley voltage of the input AC power signal $V_{AC}$. In some examples, such as where the samples generated by sampler 62 are analog samples, sampler 62 and peak and valley holder 64 may together form one or more sample-and-hold circuits. In some examples, peak and valley holder 64 may also be configured to store a representation of a frequency of the input AC power signal $V_{AC}$.

In some examples, D&D components 20B may include AC removal detector 66, which may be configured to determine whether one or more conditions has occurred to the input AC power signal $V_{AC}$. As one example, AC removal detector 66 may determine whether the input AC power signal $V_{AC}$ has been removed from connectors 3. As another example, AC removal detector 66 may determine whether the input AC power signal $V_{AC}$ has dropped out. As another example, AC removal detector 66 may determine whether the voltage and/or frequency of input AC power signal $V_{AC}$ has changed. In response to determining that the input AC power signal $V_{AC}$ has been removed from connectors 3, AC removal detector 66 may perform one or more actions to cause capacitor 6 and/or capacitor 12 to discharge. For instance, AC removal detector may output a signal that causes switch 44B and switch 44E to close.

In operation, D&D components 20B may initially charge $V_{cc}$ capacitor 46. For instance, while switch 44C and switch 44E are closed, the regulated voltage generated by regulated voltage generator 60 may be applied to a control terminal (i.e., a gate or a base) of transistor 42. In response to the regulated voltage, transistor 42 may cause $V_{cc}$ capacitor 46 to charge with a current defined by resistor 41. Once $V_{cc}$ capacitor 46 is charged to a threshold on voltage (e.g., a turn-on threshold of IC 40), D&D components 20B may cease charging $V_{cc}$ capacitor 46. For instance, D&D components 20B may open switch 44C and switch 44E.

D&D components 20B may perform one or more operations to sense the voltage of input AC power signal $V_{AC}$. For instance, D&D components 20B may close switch 44A and switch 44D. As a result of closing switch 44A and switch 44D, the voltage at nodes A, B, and C may drop to a low voltage. Additionally, the voltage at node C may correspond to (i.e., follow) the rectified AC voltage (i.e., the voltage of the rectified AC signal generated by rectifier 22). As sampler 62 may be configured to sample the voltage at node C, the samples generated by sampler 62 may correspond to the voltage of the rectified AC voltage and similarly correspond to the voltage of the input AC power signal $V_{AC}$ at connectors 3.

In accordance with one or more techniques of this disclosure, as opposed to only sensing an initial peak voltage level, D&D components 20B may perform one or more operations to measure and store an initial peak voltage level, an initial valley voltage level, and an initial frequency of a signal that corresponds to the input AC power signal $V_{AC}$. For instance, sampler 62 may determine, and peak and valley holder 64 may store, an initial peak voltage level, an initial valley voltage level, and an initial frequency of the voltage signal at node C. In some examples, D&D components 20B may perform the initial measurements in accordance with the techniques discussed below with reference to FIG. 4.

In some examples, following the initial measurements, D&D components 20B may periodically determine whether a current peak voltage level of the signal is different than the stored peak voltage level of the signal or a current valley voltage level of the signal is different than the stored valley voltage level of the signal. For instance, sampler 62 may sample the voltage at node C every quarter line frequency (i.e., one fourth of the stored frequency of the signal), and AC removal detector 66 may compare the samples with the stored peak voltage level and the stored valley voltage level. If the sample generated by sampler 62 is within a range (e.g., plus or minus 5%, 10%, 15%) of the stored sample, AC removal detector 66 may determine that the current level is not different than the stored level. For instance, if the sample generated by sampler 62 at the peak of the signal is within the range of the stored peak voltage level, AC removal detector 66 may determine that the current peak voltage level is not different than the stored peak voltage level.

D&D components 20B may determine, based on whether the current peak voltage level of the signal is different than the stored peak voltage level of the signal or the current valley voltage level of the signal is different than the stored valley voltage level of the signal, whether a change has occurred with respect to input AC power signal $V_{AC}$. Some changes that may occur with respect to input AC power signal $V_{AC}$ include input AC power signal $V_{AC}$ being removed from connectors 3 (and thus capacitor 6 and/or capacitor 12), input AC power signal $V_{AC}$ dropping out, and the voltage level of input AC power signal $V_{AC}$ changing. Further details of the removal, drop-out, and voltage change cases are respectively discussed below with reference to FIGS. 5A-5C.

In some examples, in response to determining that the current peak voltage level of the signal is different than the stored peak voltage level of the signal or that the current valley voltage level of the signal is different than the stored valley voltage level of the signal, D&D components 20B may attempt to detect and store a new peak voltage, valley voltage, and frequency of the signal. If D&D components 20B are not able to detect a new peak or valley voltage within a number AC cycles (e.g., two, three, four, five), D&D components 20B may discharge capacitor 6 and/or capacitor 12.

However, if D&D components 20B are able to detect a new peak and valley voltage within the number AC cycles, D&D components 20B may cause peak and valley holder 64 to store the new peak and valley voltages. Sampler 62 may resume periodically generating samples of the signal and AC removal detector 66 may compare the samples to the newly stored peak and valley voltages to determine whether input AC power signal $V_{AC}$ has been removed from connectors 3.

As discussed above, it may be desirable to minimize the touch current of device 2C. In accordance with one or more techniques of this disclosure, D&D components 20B may include resistor 48, resistor 50, and resistor 52 and the total resistance of resistor 48, resistor 50, and resistor 52 may be selected to minimize the touch current of device 2C. In some examples, the value of resistor 52 may be selected to minimize the touch current of device 2C based on the input line voltage (i.e., the voltage of input AC power signal $V_{AC}$) For instance, if the input line voltage is 264 VAC and the Y-capacitor value is large (e.g., 2.2 nano-farads (nF)), the total resistance of resistor 48, resistor 50, and resistor 52 may be selected to be 4 mega-ohms (MΩ) (e.g., Further details of the effect that resistor 48, resistor 50, and resistor 52 have on the touch current are discussed below with reference to FIGS. 6A, 6B, 7A, and 7B.

In some examples, such as where transistor 42 comprises a depletion MOSFET, it can be shown (e.g., in FIGS. 8A and 8B as discussed below) that where one big resistor under the source of transistor 42 and connects node A voltage to the gate of transistor 42, the current through transistor 42 will be very small and can be accepted, and that the resulting touch current will also be very small. Additionally, in some of such examples, the AC voltage over the drain of transistor 42 can be sensed through transistor 42 (e.g., inside IC 40).

In some examples, D&D components 20B may determine whether input AC signal $V_{AC}$ has been removed as follows. In the first AC cycles after IC 40 is turned on, sampler 62 sense the peak and valley voltages is sensed and peak and valley holder 64 may store the sensed peak and valley voltages as the peak and valley reference voltages. Additionally, the AC frequency $f_L$ may be detected and stored. In subsequent AC cycles, sampler 62 may generate a sample of the voltage level at every quarter of line frequency (e.g., $f_L/4$, $2f_L/4$, $3f_L/4$ and $4f_L/4$).

Nodes A, B and C may be maintained at low voltage by the feedback circuit through resistor 48 and resistor 50. The rectified AC voltage waveform may be sensed and/or sampled at node C. The voltage at node C may be sampled with peak and valley hold. AC removal detector 66 may compare the sampled data with the hold peak and valley reference voltage. If the sampled data is less than peak reference voltage and higher than valley reference voltage for three AC cycles, AC removal detector 66 may determine that the input AC signal $V_{AC}$ has been removed. In response to determining that the input AC signal $V_{AC}$ has been removed, AC removal detector 66 may send a signal that causes switch 44B to close, which results in the discharge of capacitors 6 and 12 via transistor 42.

FIG. 4 is a graph illustrating example signals and operations of a device to determine a peak voltage level, a valley voltage level, and a frequency of an AC signal, in accordance with one or more techniques of this disclosure. As illustrated in FIG. 4, graph 400 includes first plot 402 and second plot 404. First plot 402 may represent the voltage level of a rectified AC signal, such as the voltage level of the signal received by sampler 62 of D&D components 20B of FIG. 3 (i.e., the voltage at node C of FIG. 3). Second plot 404 may represent the state of a sampler, such as sampler 62 of FIG. 3. When the sampling state is "ON", sampler 62 may generate samples of the signal represented by first plot 402. Similar, when the sampling state is "OFF", sampler 62 may not generate samples of the signal represented by first plot 402.

As discussed above, D&D components 20B may determine a peak voltage level, a valley voltage level, and a frequency of an AC signal. For instance, as illustrated in FIG. 4, sampler 62 may generate samples of the voltage level at node C—which, as discussed above, may correspond to the input AC power signal $V_{AC}$—during time period 409. Sampler 62 may analyze the samples generated during period 409 to determine the peak voltage level, the valley voltage level, and the frequency of the signal at node C. As one example, sampler 62 may determine the frequency of the signal at node C by counting the number of internal clock pulses from one point of the AC cycle to another point of the AC cycle, such as the number of clock pulses from point 406 to point 408. As another example, sampler 62 may determine the peak voltage level of the signal at node C based on the value of the largest sample generated during period 409 and similar determine the valley voltage level of the signal at node C based on the value of the smallest sample generated during period 409. As discussed above, sampler 62 may cause peak and valley holder 64 to store a representation of the determined peak voltage level, the determined valley voltage level, and the determined frequency.

As discussed above, after determining the peak voltage level, the valley voltage level, and the frequency, D&D components 20B may periodically determine whether the AC signal has changed. For instance, sampler 62 may determine samples of the voltage level at node C at times 410A-410B, and AC removal detector 66 may analyze the samples to determine whether the AC signal has changed (i.e., been removed, dropped-out, or voltage level or frequency change).

Figure 5A:
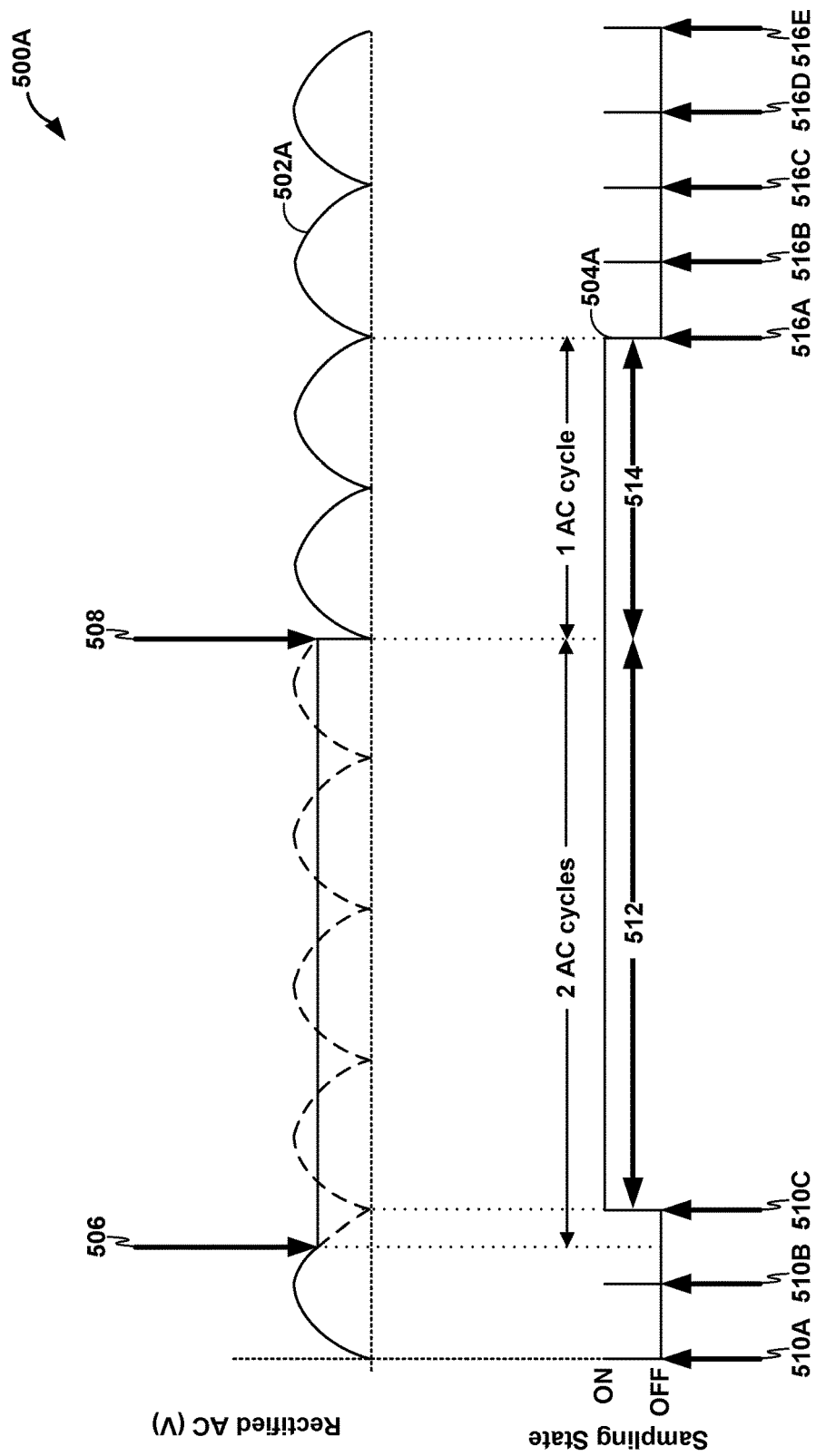
FIGS. 5A-5C are graph illustrating example signals and operations of a device to determine whether an input AC signal has changed, in accordance with one or more techniques of this disclosure.
Figure 5B:
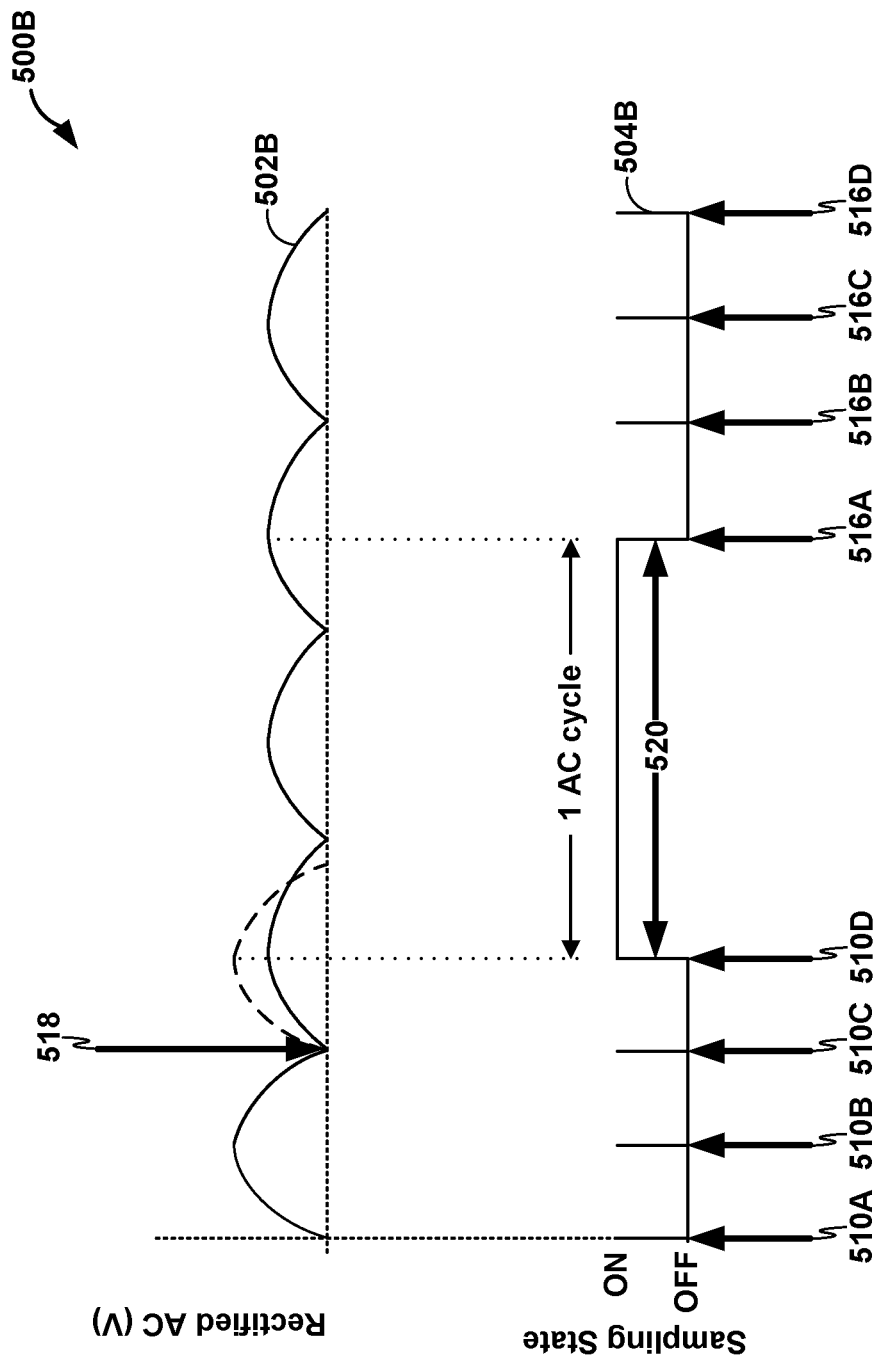
Figure 5C:
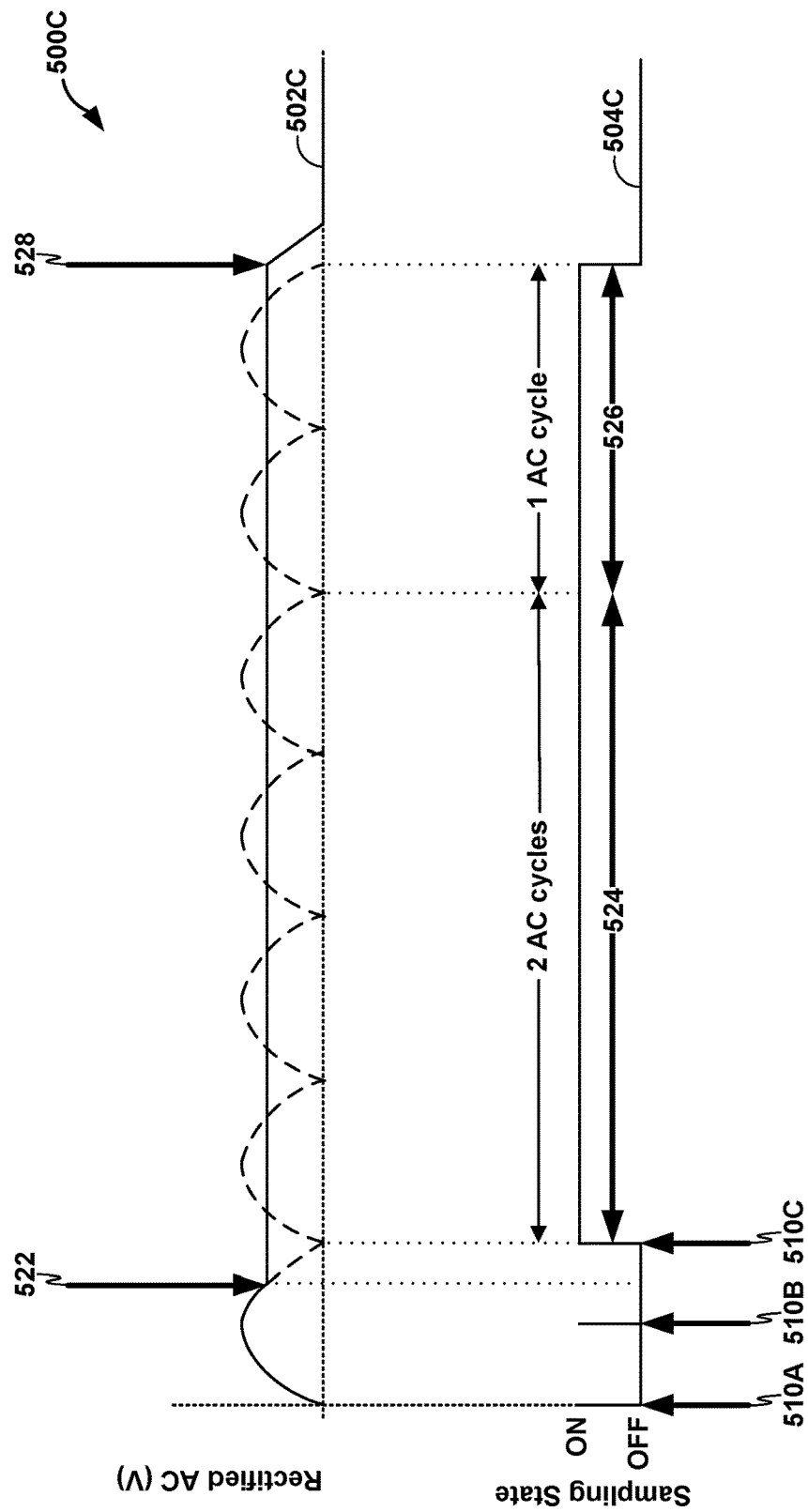

FIGS. 5A-5C are graph illustrating example signals and operations of a device to determine whether an input AC signal has changed, in accordance with one or more techniques of this disclosure. In particular, FIG. 5A illustrates example signals and operations of a device to determine whether the input AC signal has dropped-out and recovered, FIG. 5B illustrates example signals and operations of a device to determine whether a voltage level or a frequency of the input AC signal has changed, and FIG. 5C illustrates example signals and operations of a device to determine whether the input AC signal has been removed.

Each of FIGS. 5A-5C includes a respective graph of graphs 500A-500C, which each include a respective first plot of first plots 502A-502C (collectively, "first plots 502") and a respective second plot of second plots 504A-504C (collectively, "second plots 504"). Each of first plots 502 may represent the voltage level of a rectified AC signal, such as the voltage level of the signal received by sampler 62 of D&D components 20B of FIG. 3 (i.e., the voltage at node C of FIG. 3). Each of second plots 504 may represent the state of a sampler, such as sampler 62 of FIG. 3. When the sampling state is "ON", sampler 62 may generate samples of the signal represented by first plots 502. Similar, when the sampling state is "OFF", sampler 62 may not generate samples of the signal represented by first plots 502.

As discussed above, after determining the peak voltage level, the valley voltage level, and the frequency, D&D components 20B may periodically determine whether the AC signal has changed. For instance, sampler 62 may determine samples of the voltage level at node C at times 510A-510C, and AC removal detector 66 may analyze the samples to determine whether the AC signal has changed (i.e., been removed, dropped-out, or voltage level or frequency change).

When the AC line is undergoing line drop out case, the AC line would stop for a maximum of two AC cycles. After that, the AC Input would resume. As illustrated in FIG. 5A, when the line drops out at time 506, D&D components 20B cannot detect the peak or valley at the next sampling point (i.e., at time 510C). As shown in FIG. 5A, the sample generated by sampler 62 at time 510C will be different than the stored valley voltage of the AC signal. In response to the sample generated by sampler 62 at time 5100 being different than the stored valley voltage of the AC signal, AC removal detector 66 may cause sampler 62 to generate samples of the AC signal. In some examples, AC removal detector 66 may cause sampler 62 to continuously generate samples of the AC signal.

As shown by plot 502A, there may be no change in the voltage of the AC signal during the line drop out (the dashed line represents what the AC signal would be if the AC signal had not dropped-out). In order to cover the line drop time requirement and prevent a mis-triggering of the discharge mode, D&D components 20B continue to monitor the voltage but may take no action for two AC cycles (i.e., during time period 512). After that D&D components 20B may monitor the voltage level for another one AC cycle (i.e., during time period 514) to attempt to detect the peak voltage, valley voltage and line frequency. In the example of FIG. 5A, the AC signal recovers from the drop out at time 508. As such, D&D components 20B may detect and store a new peak voltage, new valley voltage, and new line frequency based on the samples generated during time period 514.

As discussed above, after determining the new peak voltage level, the new valley voltage level, and the new frequency, D&D components 20B may periodically determine whether the AC signal has changed. For instance, sampler 62 may determine samples of the voltage level at node C at times 516A-516E, and AC removal detector 66 may analyze the samples to determine whether the AC signal has changed (i.e., been removed, dropped-out, or voltage level or frequency change). As illustrated in the example of FIG. 5A, by determining samples of the voltage level at node C at times 516A-516B, sampler 62 may determine samples with a sampling frequency that is a quarter of the line frequency.

The line voltage/frequency change case illustrated in FIG. 5B is similar to the line drop-out case illustrated in FIG. 5A. However, as opposed to the line drop-out case, the AC signal does not drop out but merely changes frequency. As illustrated in FIG. 5B, the AC signal changes frequency at point 518 (the dashed line represents what the AC signal would be if the AC signal had not changed frequency), and the change in frequency causes the sample generated at time 510D to be different than the stored peak voltage. In response to the sample generated at time 510D being different than the stored peak voltage, D&D components 20B may monitor the voltage (i.e., during time period 520) to attempt to detect a new peak voltage, a new valley voltage, and a new line frequency. In the example of FIG. 5B, as the AC signal has merely changed frequencies and not dropped out, D&D components 20B may detect and store a new peak voltage, a new valley voltage, and a new line frequency for the AC signal during time period 520.

As discussed above, after determining the new peak voltage level, the new valley voltage level, and the new frequency, D&D components 20B may periodically determine whether the AC signal has changed. For instance, sampler 62 may determine samples of the voltage level at node C at times 516A-516D, and AC removal detector 66 may analyze the samples to determine whether the AC signal has changed (i.e., been removed, dropped-out, or voltage level or frequency change). As illustrated in the example of FIG. 5B, by determining samples of the voltage level at node C at times 516A-516D, sampler 62 may determine samples with a sampling frequency that is a quarter of the line frequency.

When the input AC power signal $V_{AC}$ is removed, the AC line is 0V (i.e., the voltage across connectors 3 may be zero. However, as capacitor 6 and capacitor 12 are positioned across connectors 3, removal of the input AC power signal $V_{AC}$ may not cause the voltage at node C to become zero as one or both of capacitor 6 and capacitor 12 may hold-up the voltage level at node C. For instance, as illustrated in the example of FIG. 5C, when the input AC power signal $V_{AC}$ is removed at time 522, the voltage at node C remains at its current level, which may be non-zero (the dashed line represents what the AC signal would be if the AC signal had not been removed). As also illustrated in FIG. 5C, the removal of the input AC power signal $V_{AC}$ in frequency causes the sample generated at time 510C to be different than the stored valley voltage. In response to the sample generated at time 510D being different than the stored valley voltage, D&D components 20B may monitor the voltage but may take no action for two AC cycles (i.e., during time period 524). After that D&D components 20B may monitor the voltage level for another one AC cycle (i.e., during time period 526) to attempt to detect the peak voltage, valley voltage and line frequency. In the example of FIG. 5C, as the input AC power signal $V_{AC}$ has been removed, D&D components 20B may not be able to detect the peak voltage, valley voltage and line frequency. As such, at time 528, D&D components 20B may begin to discharge capacitor 6 and or capacitor 12. For instance, AC removal detector 66 may cause switch 44B to close. In some examples, the number of AC cycles for detecting AC removal can be made configurable for end user ease of differentiating between AC drop-out and AC removal.

Figure 6A:
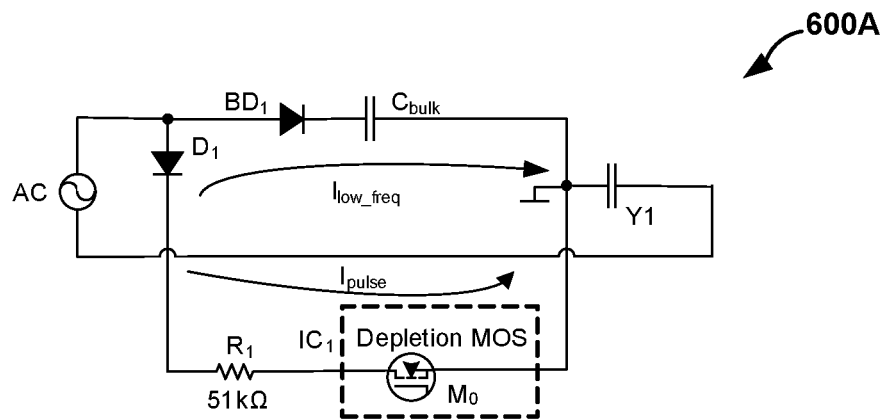
FIGS. 6A and 6B are schematic diagrams illustrating example circuits for measuring the touch current of a device, in accordance with one or more techniques of this disclosure.
Figure 6B:
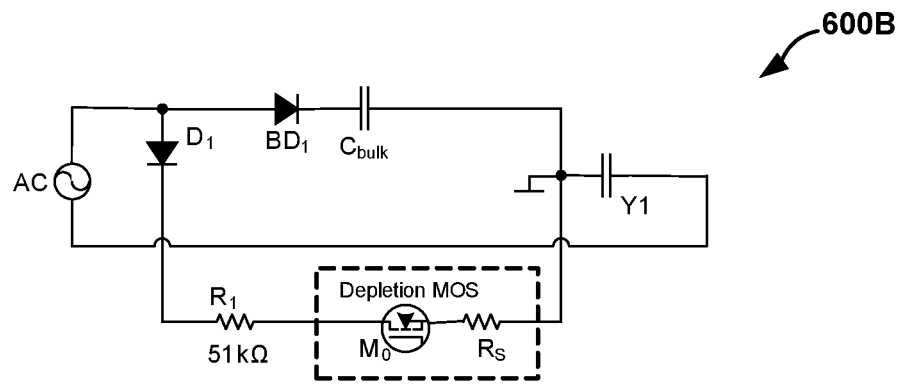

FIGS. 6A and 6B are schematic diagrams illustrating example circuits for measuring the touch current of a device, in accordance with one or more techniques of this disclosure. As illustrated in FIGS. 6A and 6B, there are two different currents going through circuits 600A and 600B (collectively, "circuits 600"). A first current, $I_{low\_freq}$, flows through $BD_1$, $C_{bulk}$, $Y_1$ and returns to AC, and a second current, $I_{pulse}$, through $R_1$, $IC_1$, $Y_1$ and returns to AC.

In the example of FIG. 6A, if $Y_1$ is 2.2 nF, AC voltage is 264 Vac, AC line frequency is 50 Hz, and IC sense frequency is 100 kHz, then $I_{low\_freq}$ equals 0.18 mA$_{rms}$ or 0.25 mA$_{peak}$ ($2 \times \pi \times 50 \times 2.2 \times 10^{-9} \times 264$) and $I_{pulse}$ equals 7.3 mA$_{peak}$ (264 Vac×sqrt(2)/51 kΩ). Therefore the overall touch current of $I_{low\_freq}$ plus $I_{pulse}$ equals 7.55 mA$_{peak}$ which is significantly larger than the maximum specified current of 0.35 mA$_{peak}$.

In accordance with one or more techniques of this disclosure and as illustrated in FIG. 6B, the overall touch current may be reduced by adding a larger resistor (i.e., $R_S$) in series with the $M_0$. If the resistance of $R_S$ is 4 MΩ, $I_{pulse}$ may be reduced to 0.093 mA$_{peak}$ (where mA$_{peak}$=voltage level of input AC power signal $V_{AC}$*sqrt(2)/resistance of $R_S$). As a result, the overall touch current of $I_{low\_freq}$ plus $I_{pulse}$ may equal 0.343 mA$_{peak}$ which is less than the maximum specified current of 0.35 mA$_{peak}$. In some examples, $R_S$ of FIG. 6B may correspond to the total resistance of resistors 48, 50, and 52 of FIG. 3. In this way, device 2C may be modified to satisfy the touch current requirement.

Figure 7A:
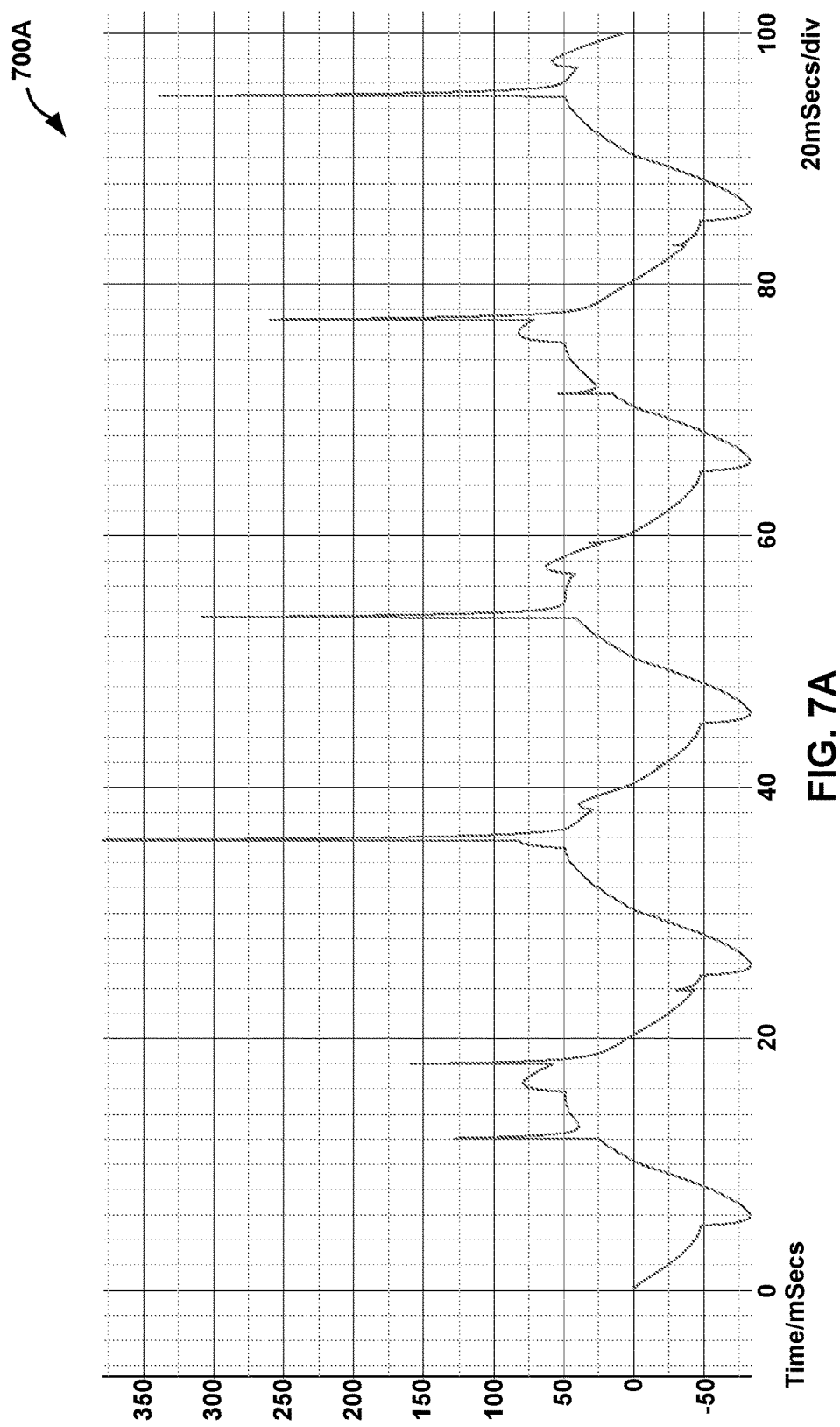
FIGS. 7A and 7B are graphs illustrating simulated touch current waveforms, in accordance with one or more techniques of this disclosure.
Figure 7B:
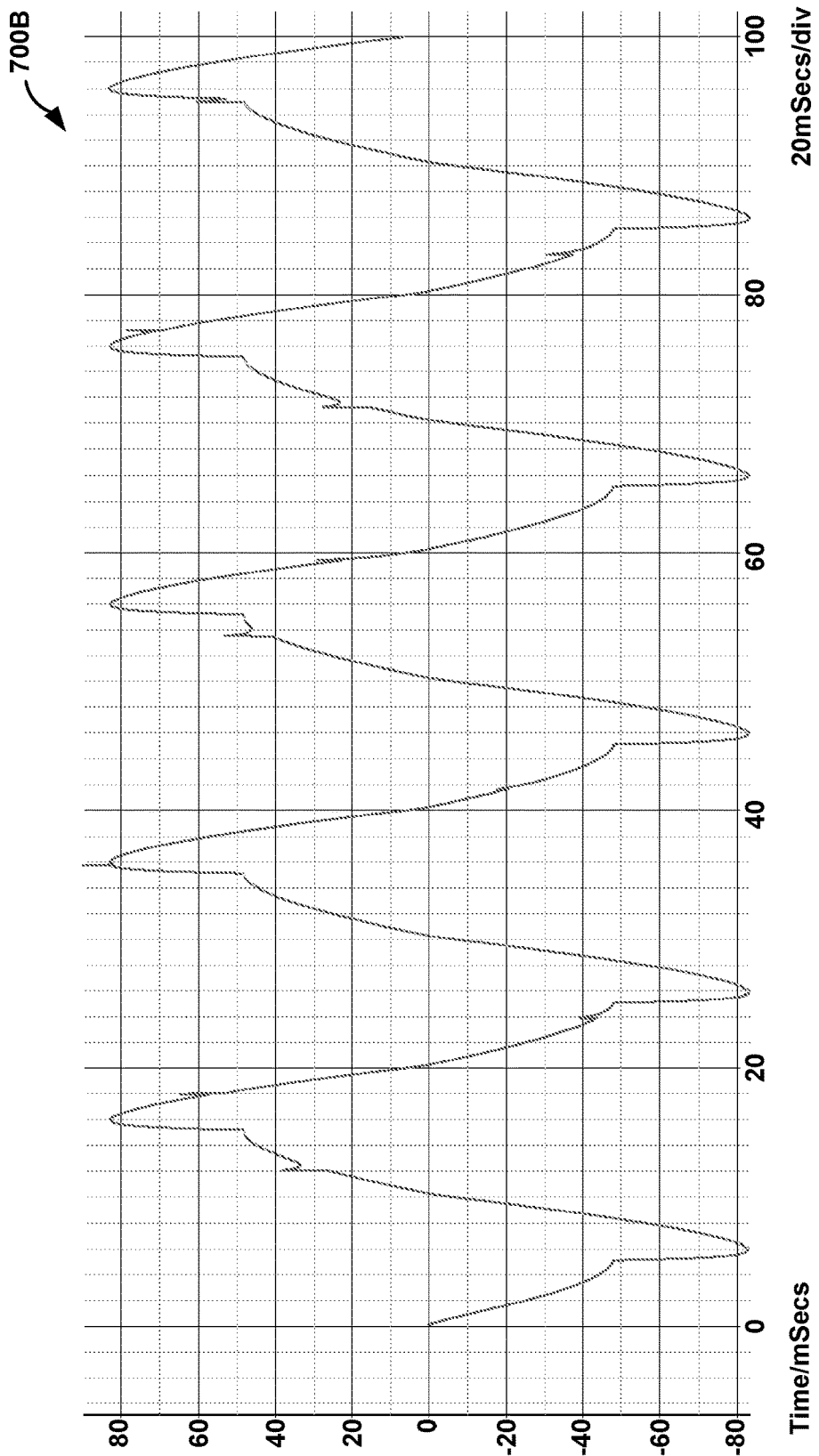

FIGS. 7A and 7B are graphs illustrating simulated touch current waveforms, in accordance with one or more techniques of this disclosure. Graph 700A of FIG. 7A illustrates the simulated touch current waveform generated by circuit 600B of FIG. 6B where the resistance of $R_S$ is 500Ω and graph 700B of FIG. 7B illustrates the simulated touch current waveform generated by circuit 600B of FIG. 6B where the resistance of $R_S$ is 2 MΩ. As can be observed, the touch current resulting from the low ohmic resistor (500Ω) in graph 700A includes several large current spikes while the touch current resulting from the high ohmic resistor (2 MΩ) in graph 700B does not include the high current spikes.

Figure 8A:
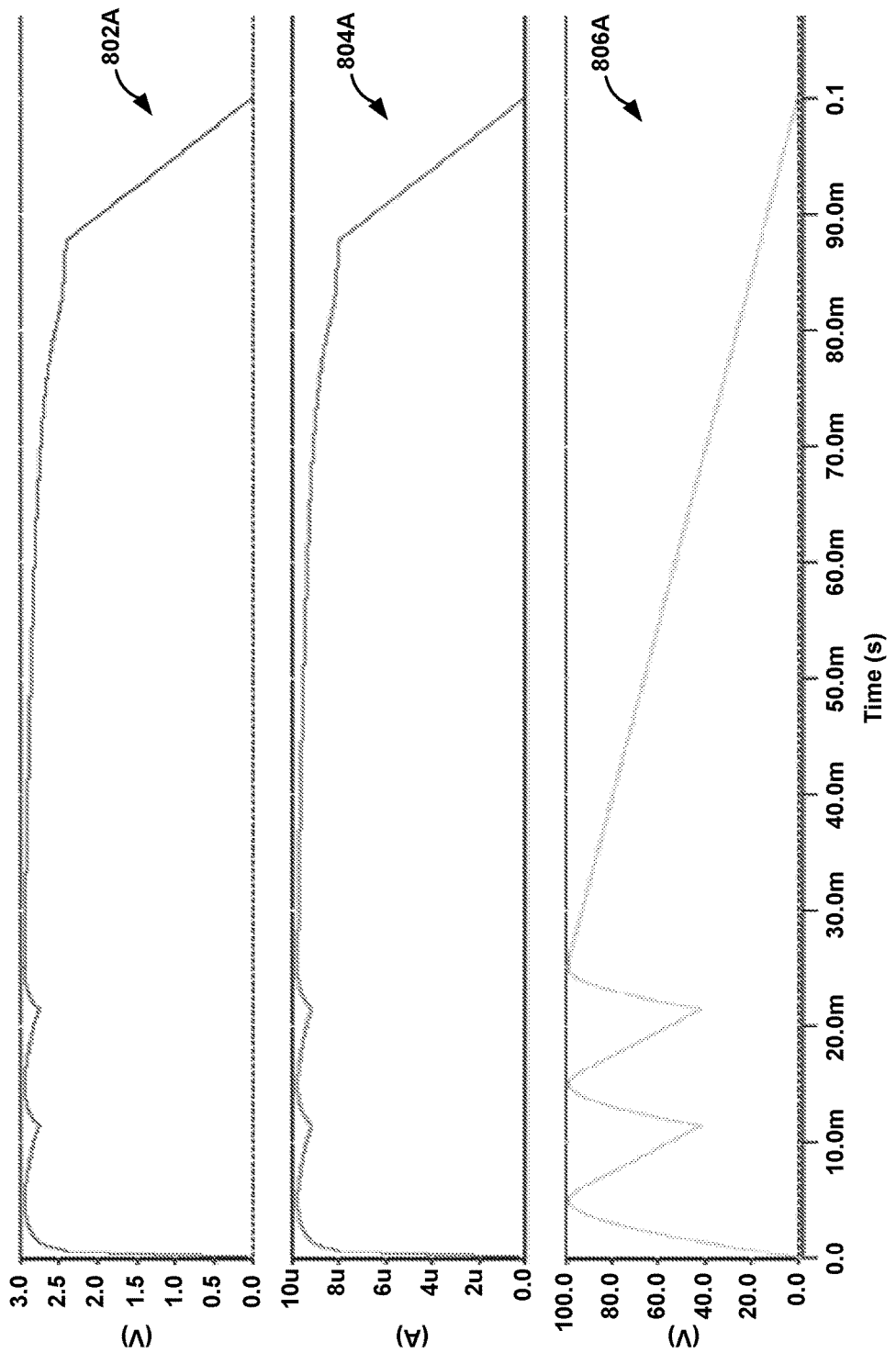
FIGS. 8A and 8B are graphs illustrating simulated voltage waveforms, in accordance with one or more techniques of this disclosure.
Figure 8B:
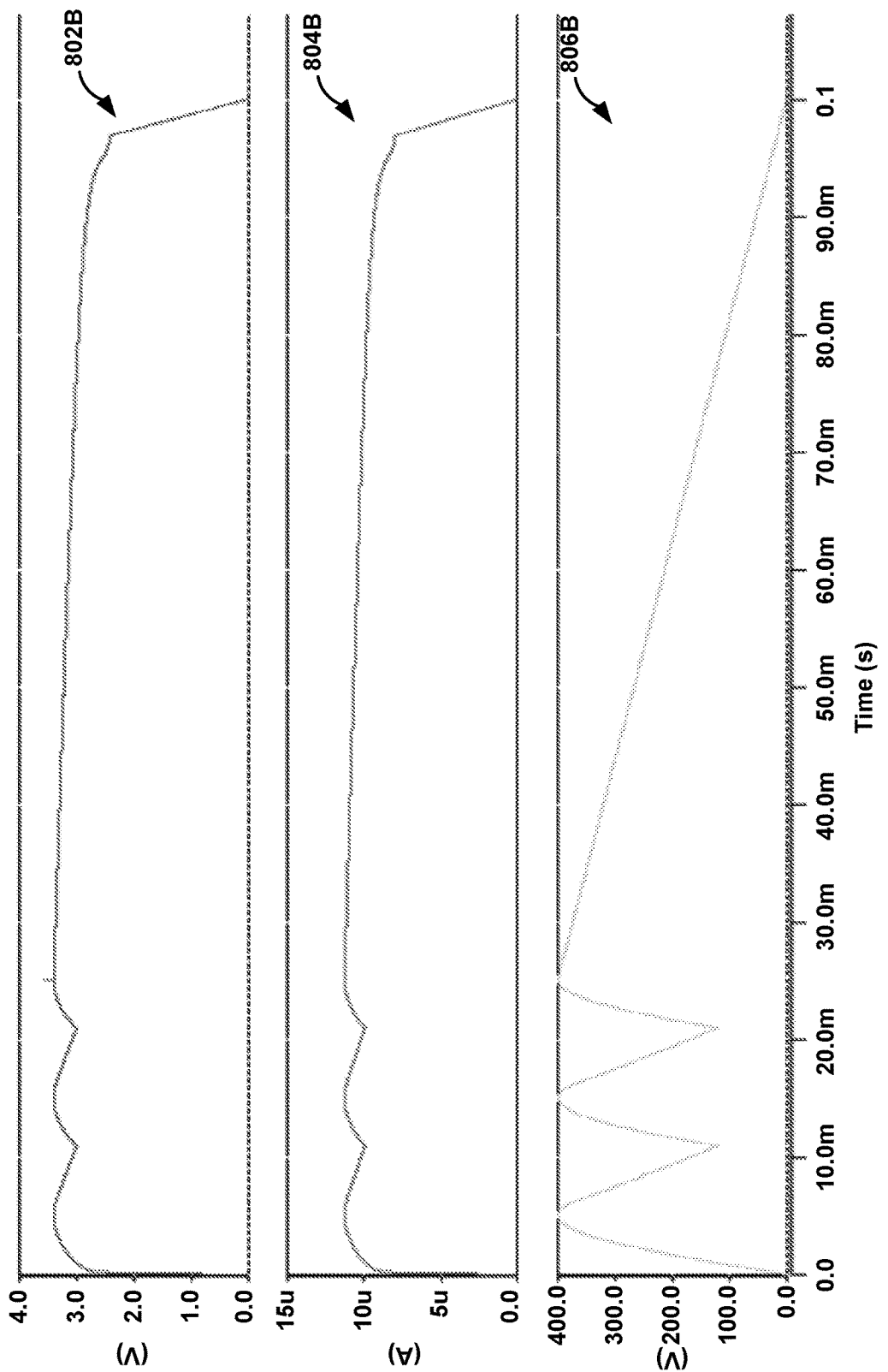

FIGS. 8A and 8B are graphs illustrating simulated voltage waveforms, in accordance with one or more techniques of this disclosure. Each of FIGS. 8A and 8B includes a respective first plot of first plots 802A and 802B (collectively, "first plots 802), a respective second plot of second plots 804A and 804B (collectively, "second plots 804), and a respective third plot of third plots 806A and 806B (collectively, "third plots 806). In some examples, first plots 802 may represent the voltage at node C of device 2C of FIG. 3, second plots 802 may represent a drain current flowing through transistor 42 of device 2C of FIG. 3, and third plots 804 may represent a drain voltage over transistor 42 of device 2C of FIG. 3. The plots FIG. 8A may represent the voltages/currents where the peak voltage of input AC signal $V_{AC}$ is 100V and the plots FIG. 8B may represent the voltages/currents where the peak voltage of input AC signal $V_{AC}$ is 400V.

As can be observed from FIGS. 8A and 8B, where a resistor under the source of transistor 42 and connects node A voltage to the gate of transistor 42, the current through transistor 42 will be very small and can be accepted, and that the resulting touch current may also be very small.

Figure 9:
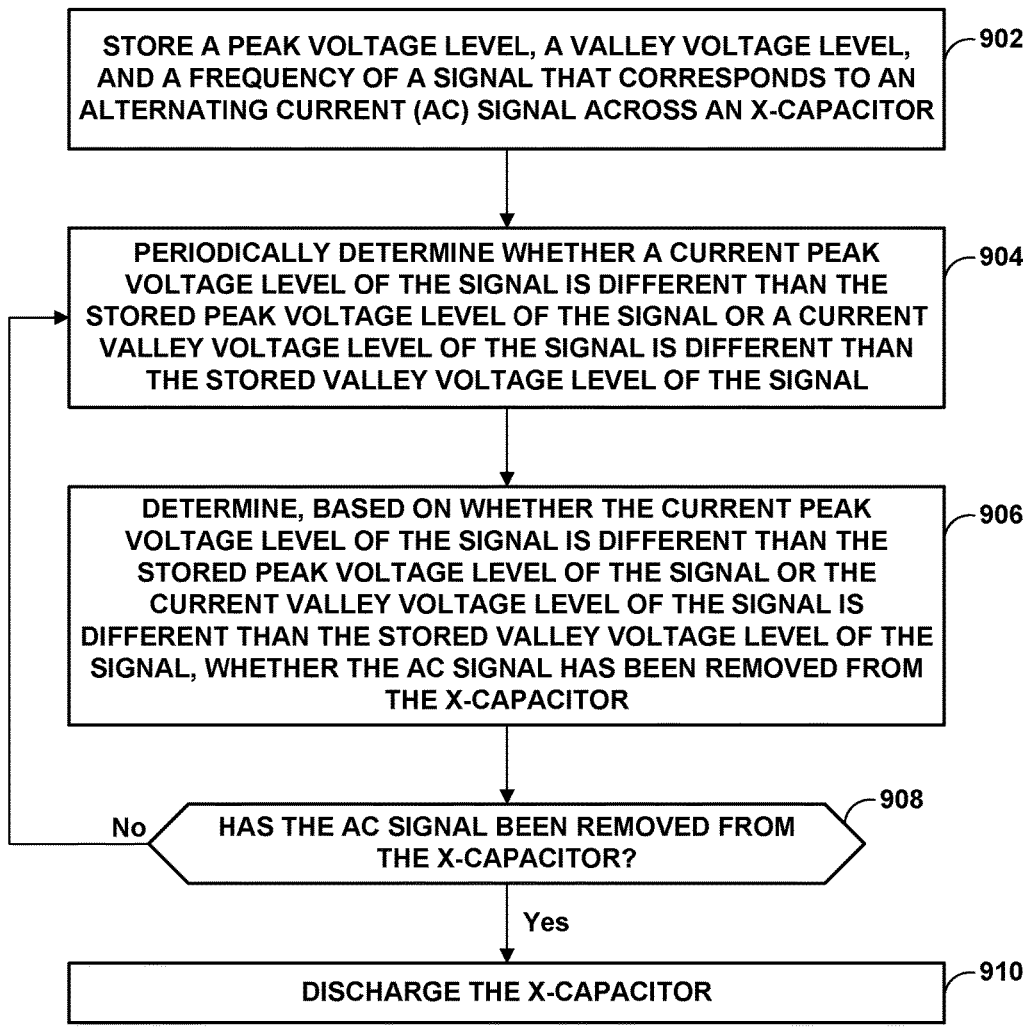
FIG. 9 is a flowchart illustrating example operations of a device configured to discharge an x-capacitor in response to determining that an input AC power signal has been removed from the device, in accordance with one or more techniques of this disclosure.

FIG. 9 is a flowchart illustrating example operations of a device configured to discharge an x-capacitor in response to determining that an input AC power signal has been removed from the device, in accordance with one or more techniques of this disclosure. For purposes of illustration only, the example operations are described below within the context of device 2C of FIG. 3, though devices having configurations different than device 302 and device 2C may perform the operations of FIG. 9.

In accordance with one or more techniques of this disclosure, device 2C may store a peak voltage level, a valley voltage level, and a frequency of a signal that corresponds to an alternating current (AC) signal across an x-capacitor, such as capacitor 6 and/or capacitor 12 of FIG. 3 (902). For instance, sampler 62 of FIG. 3 may generate one or more samples that represent the voltage at node C, which corresponds to the AC signal across capacitor 6 and/or capacitor 12, and peak and valley holder 64 may store the samples that correspond to the peak voltage level and the valley voltage level of the signal at node C along with a representation of the frequency of the signal at node C.

Device 2C may periodically determine whether a current peak voltage level of the signal is different than the stored peak voltage level of the signal or a current valley voltage level of the signal is different than the stored valley voltage level of the signal (904). For instance, sampler 62 may generate, at a frequency determined based on the stored frequency of the signal, samples that represent the voltage at node C. AC removal detector 66 may compare the samples generated by sampler 62 with the stored peak voltage level and the stored valley voltage level from peak and valley holder 64 to determine whether the current peak voltage level of the signal is different than the stored peak voltage level of the signal or the current valley voltage level of the signal is different than the stored valley voltage level of the signal.

Device 2C may determine, based on whether the current peak voltage level of the signal is different than the stored peak voltage level or the current valley voltage level of the signal is different than the stored valley voltage level, whether the AC signal has been removed from the x-capacitor (906). In some examples, AC removal detector 66 may determine that the AC signal has been removed from the x-capacitor where twelve consecutive samples are less than the stored peak voltage level and greater than the valley voltage level.

If device 2C determines that the AC signal has not been removed from the x-capacitor ("No" branch of 908), device 2C may continue to periodically determine whether a current peak voltage level of the signal is different than the stored peak voltage level of the signal or a current valley voltage level of the signal is different than the stored valley voltage level of the signal (904). However, if device 2C determines that the AC signal has been removed from the x-capacitor ("Yes" branch of 908), device 2C may discharge the x-capacitor (910).

Figure 10:
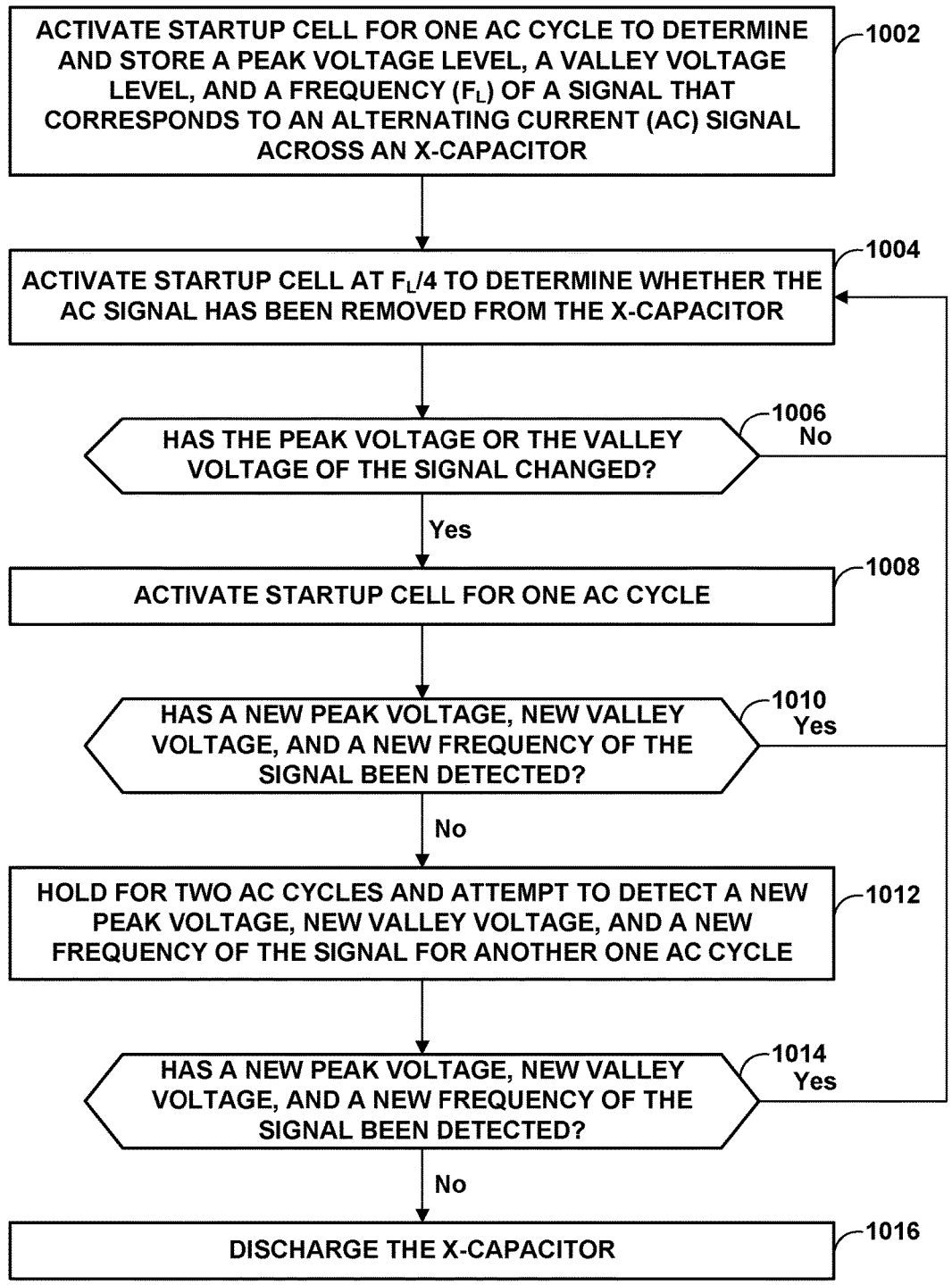
FIG. 10 is a flowchart illustrating example operations of a device configured to discharge an x-capacitor in response to determining that an input AC power signal has been removed from the device, in accordance with one or more techniques of this disclosure.

FIG. 10 is a flowchart illustrating example operations of a device configured to discharge an x-capacitor in response to determining that an input AC power signal has been removed from the device, in accordance with one or more techniques of this disclosure. For purposes of illustration only, the example operations are described below within the context of device 2C of FIG. 3, though devices having configurations different than device 302 and device 2C may perform the operations of FIG. 10.

In accordance with one or more techniques of this disclosure, device 2C may activate a startup cell, which may include one or more components of IC 40, for one AC cycle to determine and store a peak voltage level, a valley voltage level, and a frequency ($f_L$) of a signal that corresponds to an alternating current (AC) signal across an x-capacitor, such as capacitor 6 and/or capacitor 12 of FIG. 3 (1002).

Device 2C may periodically activate the startup cell (i.e., at $f_L/4$) to determine whether the AC signal has been removed from the x-capacitor (1004). To determine whether the AC signal has been removed from the x-capacitor, device 2C may determine whether the peak voltage or the valley voltage of the signal has changed (1006). If the peak voltage and the valley voltage of the signal have not changed ("No" branch of 1006), device 2C may determine that the AC signal has not been removed from the x-capacitor and continue to periodically activate the startup cell to determine whether the AC signal has been removed from the x-capacitor (1004).

If the peak voltage and the valley voltage of the signal has changed ("Yes" branch of 1006), device 2C may activate the startup cell for one AC cycle (1008) and attempt to detect a new peak voltage, a new valley voltage, and a new frequency of the signal. If device 2C is able to detect a new peak voltage, a new valley voltage, and a new frequency of the signal ("Yes" branch of 1010), device 2C may determine that the AC signal has not been removed from the x-capacitor and continue to periodically activate the startup cell to determine whether the AC signal has been removed from the x-capacitor (1004).

If device 2C is not able to detect a new peak voltage, a new valley voltage, and a new frequency of the signal ("No" branch of 1010), device 2C may hold for two AC cycles and attempt to detect a new peak voltage, a new valley voltage, and a new frequency of the signal for another one AC cycle (1012). If device 2C is able to detect a new peak voltage, a new valley voltage, and a new frequency of the signal ("Yes" branch of 1014), device 2C may determine that the AC signal has not been removed from the x-capacitor and continue to periodically activate the startup cell to determine whether the AC signal has been removed from the x-capacitor (1004). If device 2C is not able to detect a new peak voltage, a new valley voltage, and a new frequency of the signal ("No" branch of 1014), device 2C may determine that the AC signal has been removed from the X-capacitor and discharge the x-capacitor (1016).

The following numbered examples may illustrate one or more aspects of the disclosure:

Example 1

A method comprising: storing, by a device, a peak voltage level, a valley voltage level, and a frequency of a signal that corresponds to an alternating current (AC) signal across a capacitor; periodically determining, by the device and at a frequency determined based on the stored frequency of the signal, whether a current peak voltage level of the signal is different than the stored peak voltage level of the signal or a current valley voltage level of the signal is different than the stored valley voltage level of the signal; determining, based on whether the current peak voltage level of the signal is different than the stored peak voltage level or the current valley voltage level of the signal is different than the stored valley voltage level, whether the AC signal has been removed from the capacitor; and in response to determining, by the device, that the AC signal has been removed from the capacitor, discharging the capacitor.

Example 2

The method of example 1, wherein the frequency determined based on the determined frequency of the signal comprises a quarter of the stored frequency of the signal.

Example 3

The method of any combination of examples 1-2, wherein periodically determining whether the current peak voltage level of the signal is different than the stored peak voltage level of the signal or the current valley voltage level of the signal is different than the stored valley voltage level of the signal comprises sampling the voltage level of the signal at the frequency and comparing the samples to one or both of the stored peak voltage level and the stored valley voltage level; and determining whether the AC signal has been removed from the capacitor comprises determining that the AC signal has been removed from the capacitor where twelve consecutive samples are less than the stored peak voltage level and greater than the valley voltage level.

Example 4

The method of any combination of examples 1-3, wherein: determining that the current peak voltage level of the signal is different than the stored peak voltage level of the signal or the current valley voltage level of the signal is different than the stored valley voltage level of the signal comprises determining that the current peak voltage level of the signal is different than the stored peak voltage level of the signal or the current valley voltage level of the signal is different than the stored valley voltage level of the signal at a first time; discharging the capacitor comprises triggering the discharge of the capacitor before a second time; and a time difference between the first time and the second time is less than or equal to a length of four cycles at the stored frequency of the signal.

Example 5

The method of any combination of examples 1-4, wherein determining whether the AC signal has been removed from the capacitor comprises: determining that the AC signal has not been removed from the capacitor in response to determining that a line voltage of the AC signal has changed; and determining that the AC signal has not been removed from the capacitor in response to determining that the AC signal dropped-out at or before the first time and recovered from the drop-out at or before a third time that is between the first time and the second time.

Example 6

The method of any combination of examples 1-5, wherein a time difference between the first time and the third time is equal to a length of two cycles at the stored frequency of the signal, and wherein a time difference between the third time and the second time is equal to a length of one cycle at the stored frequency of the signal.

Example 7

The method of any combination of examples 1-6, wherein determining that the line voltage of the AC signal has changed comprises determining whether the line voltage of the AC signal has changed based on whether the current peak voltage level of the signal is different than the stored peak voltage level of the signal or the current valley voltage level of the signal is different than the stored valley voltage level of the signal, the method further comprising: in response to determining that the line voltage of the AC signal has changed, respectively updating, by the device, the stored peak voltage level, the stored valley voltage level, and the stored frequency of the signal with the current peak voltage level, the current valley voltage level, and a current frequency of the signal.

Example 8

The method of any combination of examples 1-7, wherein the valley voltage of the AC signal is non-zero.

Example 9

The method of any combination of examples 1-8, wherein the capacitor is an x-capacitor.

Example 10

The method of any combination of examples 1-9, wherein: determining whether a current peak voltage level of the signal is different than the stored peak voltage level of the signal or a current valley voltage level of the signal is different than the stored valley voltage level of the signal comprises sampling the voltage level of the signal with a relatively high resistance between the capacitor and ground; and discharging the capacitor comprises discharging the capacitor with a relatively low resistance, as compared to the relatively high resistance, between the capacitor and ground.

Example 11

A device comprising: one or more components configured to discharge a capacitor; an analog-to-digital converter (ADC) configured to generate samples that represent voltage levels of a signal that corresponds to an alternating current (AC) signal across the capacitor; and one or more processors configured to: determine, based on samples generated by the ADC, a peak voltage level, a valley voltage level, and a frequency of the signal; periodically determine, based on samples generated at a frequency determined based on the stored frequency of the signal, whether a current peak voltage level of the signal is different than the stored peak voltage level of the signal or a current valley voltage level of the signal is different than the stored valley voltage level of the signal; determine, based on whether the current peak voltage level of the signal is different than the stored peak voltage level or the current valley voltage level of the signal is different than the stored valley voltage level, whether the AC signal has been removed from the capacitor; and in response to determining that the AC signal has been removed from the capacitor, cause the one or more components to discharge the capacitor.

Example 12

The device of example 11, wherein the frequency determined based on the determined frequency of the signal comprises a quarter of the stored frequency of the signal.

Example 13

The device of any combination of examples 11-12, wherein: the ADC is configured to sample the voltage level of the signal at the frequency to periodically determine whether the current peak voltage level of the signal is different than the stored peak voltage level of the signal or the current valley voltage level of the signal is different than the stored valley voltage level of the signal, the one or more processors are configured to compare the samples to one or both of the stored peak voltage level and the stored valley voltage level; and the one or more processors are configured to determine that the AC signal has been removed from the capacitor where twelve consecutive samples are less than the stored peak voltage level and greater than the valley voltage level.

Example 14

The device of any combination of examples 11-13, wherein: the one or more processors are configured to determine that the current peak voltage level of the signal is different than the stored peak voltage level of the signal or the current valley voltage level of the signal is different than the stored valley voltage level of the signal at a first time; the one or more processors are configured to cause the one or more components to discharge the capacitor before a second time; and wherein a time difference between the first time and the second time is less than or equal to a length of four cycles at the stored frequency of the signal.

Example 15

The device of any combination of examples 11-14, wherein, to determine whether the AC signal has been removed from the capacitor, the one or more processors are configured to: determine that the AC signal has not been removed from the capacitor in response to determining that a line voltage of the AC signal has changed; and determine that the AC signal has not been removed from the capacitor in response to determining that the AC signal dropped-out at or before the first time and recovered from the drop-out at or before a third time that is between the first time and the second time.

Example 16

The device of any combination of examples 11-15, wherein a time difference between the first time and the third time is equal to a length of two cycles at the stored frequency of the signal, and wherein a time difference between the third time and the second time is equal to a length of one cycle at the stored frequency of the signal.

Example 17

The device of any combination of examples 11-16, wherein: the one or more processors are configured to determine whether the line voltage of the AC signal has changed based on whether the current peak voltage level of the signal is different than the stored peak voltage level of the signal or the current valley voltage level of the signal is different than the stored valley voltage level of the signal; and in response to determining that the line voltage of the AC signal has changed, the one or more processors are further configured to respectively update, by the device, the stored peak voltage level, the stored valley voltage level, and the stored frequency of the signal with the current peak voltage level, the current valley voltage level, and a current frequency of the signal.

Example 18

The device of any combination of examples 11-17, wherein the valley voltage of the AC signal is non-zero.

Example 19

The device of any combination of examples 11-18, wherein the capacitor is an x-capacitor.

Example 20

A device comprising: means for storing a peak voltage level, a valley voltage level, and a frequency of a signal that corresponds to an alternating current (AC) signal across a capacitor; means for periodically determining, at a frequency determined based on the stored frequency of the signal, whether a current peak voltage level of the signal is different than the stored peak voltage level of the signal or a current valley voltage level of the signal is different than the stored valley voltage level of the signal; means for determining, based on whether the current peak voltage level of the signal is different than the stored peak voltage level or the current valley voltage level of the signal is different than the stored valley voltage level, whether the AC signal has been removed from the x-capacitor; and means for discharging the capacitor in response to determining that the AC signal has been removed from the x-capacitor.

Example 21

The device of example 20, further comprising means for performing the method of any combination of examples 1-10.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules, or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
storing, by a device, a peak voltage level, a valley voltage level, and a frequency of a signal that corresponds to an alternating current (AC) signal across a capacitor, wherein the peak voltage level is stored in a first register and the valley voltage level is stored in a second register;
periodically determining, by the device and at a frequency determined based on the stored frequency of the signal, whether a current peak voltage level of the signal is different than the stored peak voltage level of the signal and whether a current valley voltage level of the signal is different than the stored valley voltage level of the signal;
determining, based on whether the current peak voltage level of the signal is different than the stored peak voltage level or the current valley voltage level of the signal is different than the stored valley voltage level, whether the AC signal has been removed from the capacitor; and
in response to determining, by the device, that the AC signal has been removed from the capacitor, discharging the capacitor.

2. The method of claim 1, wherein the frequency determined based on the determined frequency of the signal comprises a quarter of the stored frequency of the signal.

3. The method of claim 2, wherein
periodically determining whether the current peak voltage level of the signal is different than the stored peak voltage level of the signal or the current valley voltage level of the signal is different than the stored valley voltage level of the signal comprises sampling the voltage level of the signal at the frequency and comparing the samples to one or both of the stored peak voltage level and the stored valley voltage level; and
determining whether the AC signal has been removed from the capacitor comprises determining that the AC signal has been removed from the capacitor where twelve consecutive samples are less than the stored peak voltage level and greater than the valley voltage level.

4. The method of claim 1, wherein:
determining that the current peak voltage level of the signal is different than the stored peak voltage level of the signal or the current valley voltage level of the signal is different than the stored valley voltage level of the signal comprises determining that the current peak voltage level of the signal is different than the stored peak voltage level of the signal or the current valley voltage level of the signal is different than the stored valley voltage level of the signal at a first time;
discharging the capacitor comprises triggering the discharge of the capacitor before a second time; and
a time difference between the first time and the second time is less than or equal to a length of four cycles at the stored frequency of the signal.

5. The method of claim 4, wherein determining whether the AC signal has been removed from the capacitor comprises:
determining that the AC signal has not been removed from the capacitor in response to determining that a line voltage of the AC signal has changed; and
determining that the AC signal has not been removed from the capacitor in response to determining that the AC signal dropped-out at or before the first time and recovered from the drop-out at or before a third time that is between the first time and the second time.

6. The method of claim 5, wherein a time difference between the first time and the third time is equal to a length of two cycles at the stored frequency of the signal, and wherein a time difference between the third time and the second time is equal to a length of one cycle at the stored frequency of the signal.

7. The method of claim 5, wherein determining that the line voltage of the AC signal has changed comprises determining whether the line voltage of the AC signal has changed based on whether the current peak voltage level of the signal is different than the stored peak voltage level of the signal or the current valley voltage level of the signal is different than the stored valley voltage level of the signal, the method further comprising:
in response to determining that the line voltage of the AC signal has changed, respectively updating, by the device, the stored peak voltage level, the stored valley voltage level, and the stored frequency of the signal with the current peak voltage level, the current valley voltage level, and a current frequency of the signal.

8. The method of claim 1, wherein the valley voltage of the AC signal is non-zero.

9. The method of claim 1, wherein the capacitor is an x-capacitor.

10. The method of claim 1, wherein:
determining whether a current peak voltage level of the signal is different than the stored peak voltage level of the signal or a current valley voltage level of the signal is different than the stored valley voltage level of the signal comprises sampling the voltage level of the signal with a relatively high resistance between the capacitor and ground; and
discharging the capacitor comprises discharging the capacitor with a relatively low resistance, as compared to the relatively high resistance, between the capacitor and ground.

11. The method of claim 1, wherein a level of the stored peak voltage level of the signal is different than a level of the stored valley voltage level of the signal.

12. A device comprising:
one or more components configured to discharge a capacitor;
an analog-to-digital converter (ADC) configured to generate samples that represent voltage levels of a signal that corresponds to an alternating current (AC) signal across the capacitor; and
one or more processors configured to:
store, based on samples generated by the ADC, a peak voltage level, a valley voltage level, and a frequency of the signal, wherein the peak voltage level is stored in a first register and the valley voltage level is stored in a second register;

periodically determine, based on samples generated at a frequency determined based on the stored frequency of the signal, whether a current peak voltage level of the signal is different than the stored peak voltage level of the signal and whether a current valley voltage level of the signal is different than the stored valley voltage level of the signal;

determine, based on whether the current peak voltage level of the signal is different than the stored peak voltage level or the current valley voltage level of the signal is different than the stored valley voltage level, whether the AC signal has been removed from the capacitor; and in response to determining that the AC signal has been removed from the capacitor, cause the one or more components to discharge the capacitor.

13. The device of claim 12, wherein the frequency determined based on the determined frequency of the signal comprises a quarter of the stored frequency of the signal.

14. The device of claim 13, wherein:
the ADC is configured to sample the voltage level of the signal at the frequency,
to periodically determine whether the current peak voltage level of the signal is different than the stored peak voltage level of the signal or the current valley voltage level of the signal is different than the stored valley voltage level of the signal, the one or more processors are configured to compare the samples to one or both of the stored peak voltage level and the stored valley voltage level; and
the one or more processors are configured to determine that the AC signal has been removed from the capacitor where twelve consecutive samples are less than the stored peak voltage level and greater than the valley voltage level.

15. The device of claim 12, wherein:
the one or more processors are configured to determine that the current peak voltage level of the signal is different than the stored peak voltage level of the signal or the current valley voltage level of the signal is different than the stored valley voltage level of the signal at a first time;
the one or more processors are configured to cause the one or more components to discharge the capacitor before a second time; and
wherein a time difference between the first time and the second time is less than or equal to a length of four cycles at the stored frequency of the signal.

16. The device of claim 15, wherein, to determine whether the AC signal has been removed from the capacitor, the one or more processors are configured to:
determine that the AC signal has not been removed from the capacitor in response to determining that a line voltage of the AC signal has changed; and
determine that the AC signal has not been removed from the capacitor in response to determining that the AC signal dropped-out at or before the first time and recovered from the drop-out at or before a third time that is between the first time and the second time.

17. The device of claim 16, wherein a time difference between the first time and the third time is equal to a length of two cycles at the stored frequency of the signal, and wherein a time difference between the third time and the second time is equal to a length of one cycle at the stored frequency of the signal.

18. The device of claim 16, wherein:
the one or more processors are configured to determine whether the line voltage of the AC signal has changed based on whether the current peak voltage level of the signal is different than the stored peak voltage level of the signal or the current valley voltage level of the signal is different than the stored valley voltage level of the signal; and
in response to determining that the line voltage of the AC signal has changed, the one or more processors are further configured to respectively update, by the device, the stored peak voltage level, the stored valley voltage level, and the stored frequency of the signal with the current peak voltage level, the current valley voltage level, and a current frequency of the signal.

19. The device of claim 12, wherein the capacitor is an x-capacitor.

20. A device comprising:
means for storing a peak voltage level, a valley voltage level, and a frequency of a signal that corresponds to an alternating current (AC) signal across a capacitor, wherein the peak voltage level is stored in a first register and the valley voltage level is stored in a second register;
means for periodically determining, at a frequency determined based on the stored frequency of the signal, whether a current peak voltage level of the signal is different than the stored peak voltage level of the signal and whether a current valley voltage level of the signal is different than the stored valley voltage level of the signal;
means for determining, based on whether the current peak voltage level of the signal is different than the stored peak voltage level or the current valley voltage level of the signal is different than the stored valley voltage level, whether the AC signal has been removed from the x-capacitor; and
means for discharging the capacitor in response to determining that the AC signal has been removed from the x-capacitor.

* * * * *